United States Patent
Koyanagi et al.

(10) Patent No.: US 10,177,118 B2
(45) Date of Patent: Jan. 8, 2019

(54) SEMICONDUCTOR DEVICE AND METHOD FOR MANUFACTURING THE SAME

(71) Applicants: TOHOKU UNIVERSITY, Sendai-shi, Miyagi (JP); TOSHIBA MEMORY CORPORATION, Tokyo (JP)

(72) Inventors: Mitsumasa Koyanagi, Sendai (JP); Tetsu Tanaka, Sendai (JP); Takafumi Fukushima, Sendai (JP); Kang-Wook Lee, Sendai (JP)

(73) Assignees: TOHOKU UNIVERSITY, Sendai (JP); TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/449,001

(22) Filed: Mar. 3, 2017

(65) Prior Publication Data

US 2017/0200703 A1 Jul. 13, 2017

Related U.S. Application Data

(63) Continuation-in-part of application No. PCT/JP2015/073934, filed on Aug. 26, 2015.

(30) Foreign Application Priority Data

Sep. 3, 2014 (JP) ................................. 2014-179486

(51) Int. Cl.
*H01L 23/58* (2006.01)
*H01L 25/065* (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
CPC .......... H01L 25/0657; H01L 21/76898; H01L 23/481; H01L 24/11; H01L 24/17; H01L 24/81; H01L 25/50
See application file for complete search history.

(56) References Cited

U.S. PATENT DOCUMENTS 9,337,125 B2* 5/2016 Park ................. H01L 23/53238
2010/0200989 A1* 8/2010 Sprey ................ H01L 21/02126
257/741
(Continued)

FOREIGN PATENT DOCUMENTS

JP H08-315946 A 11/1996
JP 2006-019328 A 1/2006
(Continued)

OTHER PUBLICATIONS

Sekisui Chemical Co., LTD. About Sekisui What's New Archive. Press Release. May 27, 2014.
(Continued)

*Primary Examiner* — Victor A Mandala
*Assistant Examiner* — Colleen E Snow
(74) *Attorney, Agent, or Firm* — Oliff PLC

(57) ABSTRACT

To miniaturize metal columns. A semiconductor device includes a metal column (14) that extends in a stretching direction; a polymer layer (16) that surrounds the metal column from a direction crossing the stretching direction; and a guide (12) that surrounds the polymer layer in the crossing direction so as to be spaced from the metal column with the polymer layer interposed therebetween. A method for manufacturing semiconductor devices includes a step of filling a mixture (20) containing metal particles (22) and polymers (24) in a guide (12); and a step of subjecting the mixture to a heat treatment so that the polymers agglomerate to the guide to form a polymer layer (16) that makes contact with the guide and the metal particles agglomerate away
(Continued)

from the guide with the polymer layer interposed therebetween to form a metal column (14) that stretches in a stretching direction of the guide from the metal particles.

21 Claims, 16 Drawing Sheets

(51) Int. Cl.
   *H01L 23/522* (2006.01)
   *H01L 21/768* (2006.01)
   *H01L 23/48* (2006.01)
   *H01L 23/00* (2006.01)
   *H01L 25/00* (2006.01)

(52) U.S. Cl.
   CPC ............ *H01L 23/522* (2013.01); *H01L 24/11* (2013.01); *H01L 24/17* (2013.01); *H01L 24/81* (2013.01); *H01L 25/50* (2013.01); *H01L 2224/0401* (2013.01); *H01L 2224/05568* (2013.01); *H01L 2224/05647* (2013.01); *H01L 2224/11013* (2013.01); *H01L 2224/1131* (2013.01); *H01L 2224/11848* (2013.01); *H01L 2224/13025* (2013.01); *H01L 2224/16148* (2013.01); *H01L 2224/81191* (2013.01); *H01L 2224/81193* (2013.01); *H01L 2225/06513* (2013.01); *H01L 2225/06541* (2013.01); *H01L 2225/06562* (2013.01); *H01L 2225/06565* (2013.01); *H01L 2225/06593* (2013.01); *H01L 2924/0002* (2013.01)

(56) References Cited

U.S. PATENT DOCUMENTS

| 2012/0074584 A1* | 3/2012 | Lee | ................... H01L 21/76898 257/774 |
| 2012/0094437 A1* | 4/2012 | Han | ................... H01L 21/76801 438/109 |

FOREIGN PATENT DOCUMENTS

| JP | 2010-114155 A | 5/2010 |
| JP | 2011-018778 A | 1/2011 |
| JP | 2012-009820 A | 1/2012 |
| JP | 2012-015209 A | 1/2012 |
| JP | 2014-005325 A | 1/2014 |
| JP | 2014-238921 A | 12/2014 |
| WO | 2013146538 A1 | 10/2013 |

OTHER PUBLICATIONS

Mar. 7, 2017 International Preliminary Report on Patentability issued in International Patent Application No. PCT/JP2015/073934.

* cited by examiner

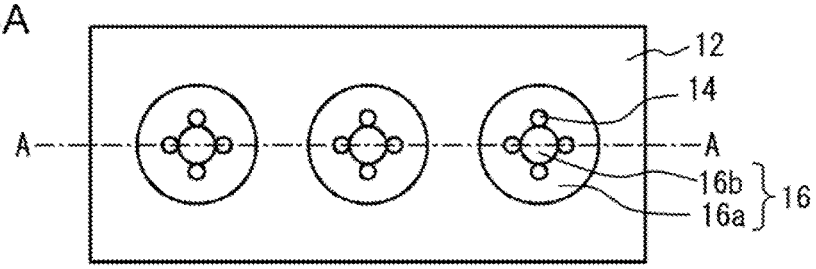
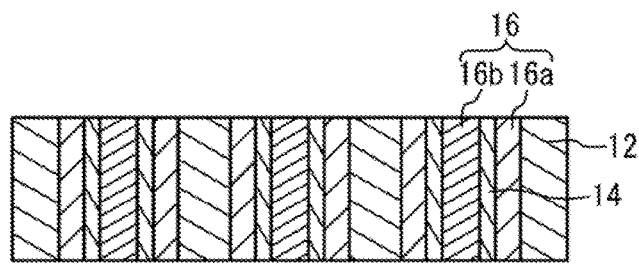

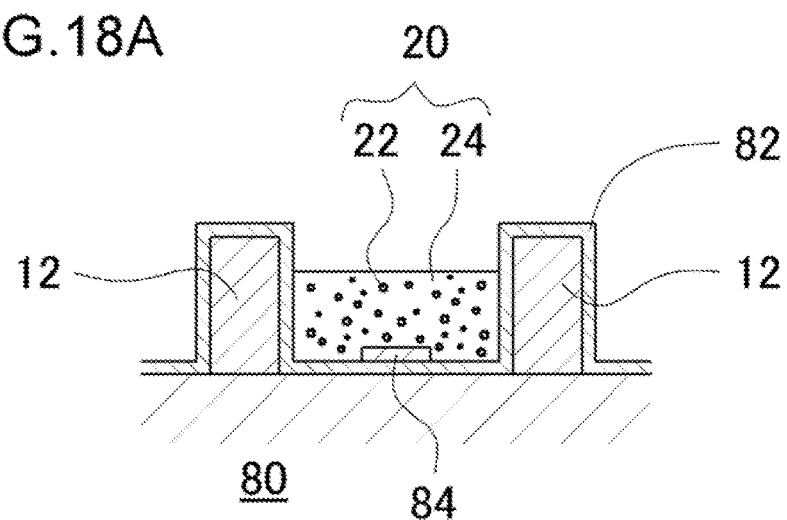
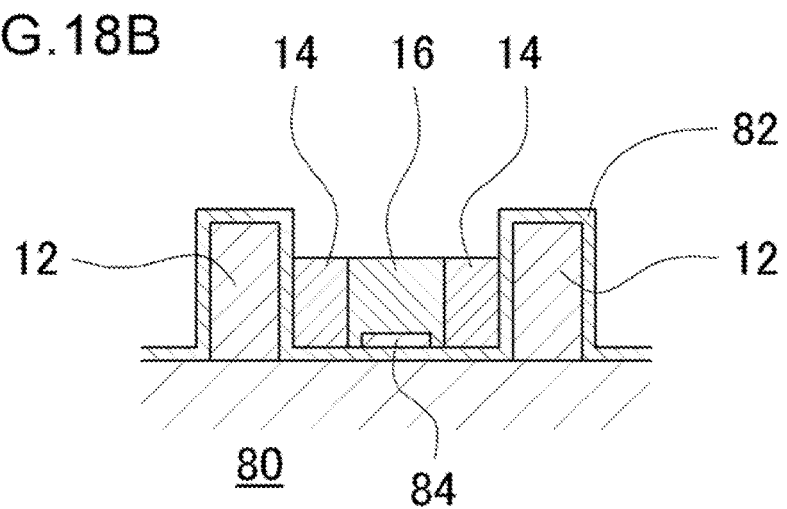

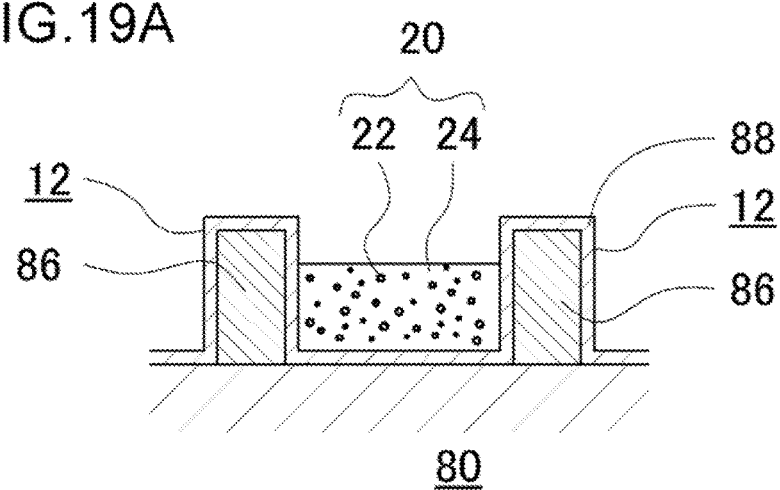
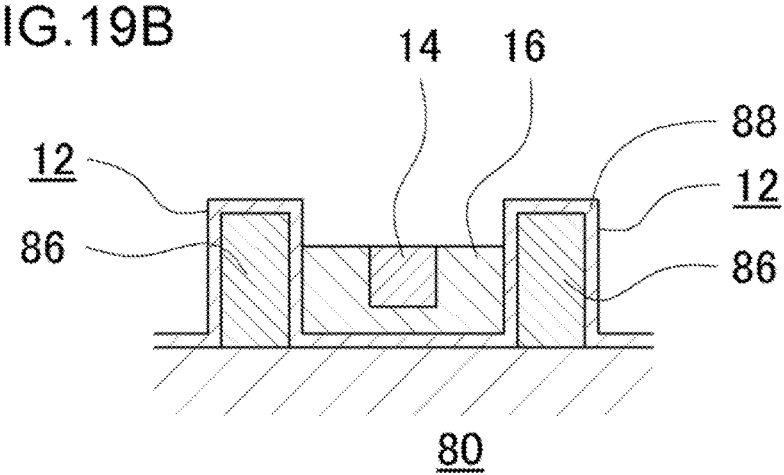

SEMICONDUCTOR DEVICE AND METHOD FOR MANUFACTURING THE SAME

This is a Continuation-in-Part of Application No. PCT/JP2015/073934 filed Aug. 26, 2015, which claims the benefit of Japanese Application No. 2014-179486 filed Sep. 3, 2014. The disclosures of the prior applications are hereby incorporated by reference herein in their entirety.

TECHNICAL FIELD

The present invention relates to a semiconductor device and a method for manufacturing the same, and more specifically, relates to a semiconductor device having metal columns and a method for manufacturing the same.

BACKGROUND ART

Miniaturization of metal columns such as through-silicon vias (TSVs) which are penetration electrodes that pass through semiconductor substrates and bumps for connecting semiconductor chips is required to realize miniaturization of 3-dimensional integrated circuits.

Patent Documents 1 and 2 disclose techniques for forming fine periodic patterns using self-organizing polymers. Non-Patent Document 1 discloses a technique for heating an anisotropic conductive paste in which solder particles are dispersed so that the solder particles agglomerate in an electrode portion and a metallic bond is formed between the electrode and the solder.

CITATION LIST

Patent Document

Patent Document 1: Japanese Patent Application Laid-Open No. 2013-146538
Patent Document 2: Japanese Patent Application Laid-Open No. 2014-005325

Non-Patent Document

Non-Patent Document 1: Sekisui Chemical Co., Ltd., Press Release, May 27, 2014, <URL: http://www.sekisui.co.jp/news/2014/1244746_20127.html>

SUMMARY OF THE INVENTION

Problems to be Solved by the Invention

Patent Documents 1 and 2 do not disclose how to form metal columns such as penetration electrodes and bumps. In Non-Patent Document 1, it is not possible to miniaturize bumps.

The present invention has been made in view of the above-described problems and an object thereof is to miniaturize metal columns.

Solutions to Problems

The present invention provides a semiconductor device including: a metal column that extends in a stretching direction; a polymer layer that surrounds the metal column from a direction crossing the stretching direction; and a guide that surrounds the polymer layer in the crossing direction so as to be spaced from the metal column with the polymer layer interposed therebetween.

In this configuration, the semiconductor device may further include a first substrate and a second substrate stacked in the stretching direction, and the metal column may be a bump that electrically connects the first and second substrates.

In this configuration, the guide may be provided in at least one of the first and second substrates.

In this configuration, the semiconductor device may further include a plurality of first electrodes provided on a surface of the first substrate facing the second substrate; and a plurality of second electrodes provided on a surface of the second substrate facing the first substrate, and the metal column may connect the plurality of first electrodes and the plurality of second electrodes.

In this configuration, the semiconductor device may further include a first circuit provided in the first substrate so as to be electrically connected to the plurality of first electrodes; a second circuit provided in the second substrate so as to be electrically connected to the plurality of second electrodes; a detection circuit that detects a second electrode of the plurality of second electrodes to which at least one first electrode of the plurality of first electrodes is connected; and a switching circuit that switches at least one of connection between the first circuit and the plurality of first electrodes and connection between the second circuit and the plurality of second electrodes on the basis of a detection result of the detection circuit.

In this configuration, the semiconductor device may further include a semiconductor substrate, and the guide may be an insulator film formed on an inner surface of a through-hole that passes through the semiconductor substrate, the polymer layer may be filled in the through-hole, and the metal column may be a penetration electrode that passes through the polymer layer.

In this configuration, a plurality of the metal columns may be provided in the guide.

In this configuration, one metal column may be provided in the guide.

In this configuration, the guide may be hydrophilic and a region of the polymer layer making contact with the guide may be hydrophilic.

In this configuration, the polymer layer may include a hydrophilic polymer layer provided on an inner side of the guide and a hydrophobic polymer layer provided on an inner side of the hydrophilic polymer layer, and the metal column may be provided on an inner side of the hydrophobic polymer layer.

In this configuration, the polymer layer may include a hydrophilic polymer layer provided on an inner side of the guide and a hydrophobic polymer layer provided on an inner side of the hydrophilic polymer layer, and the metal column may be provided in a ring form between the hydrophilic polymer layer and the hydrophobic polymer layer.

In this configuration, the polymer layer may include a hydrophilic polymer layer provided on an inner side of the guide and a hydrophobic polymer layer provided on an inner side of the hydrophilic polymer layer, and a plurality of the metal columns may be provided between the hydrophilic polymer layer and the hydrophobic polymer layer.

In this configuration, the guide may be hydrophobic and a region of the polymer layer making contact with the guide may be hydrophobic.

In this configuration, the polymer layer may include a hydrophobic polymer layer provided on an inner side of the guide and a hydrophilic polymer layer provided on an inner side of the hydrophilic polymer layer, and the metal column may be provided on an inner side of the hydrophilic polymer layer.

In this configuration, the polymer layer may include a hydrophobic polymer layer provided on an inner side of the guide and a hydrophilic polymer layer provided on an inner side of the hydrophilic polymer layer, and the metal column may be provided in a ring form between the hydrophobic polymer layer and the hydrophilic polymer layer.

In this configuration, the polymer layer may include a hydrophobic polymer layer provided on an inner side of the guide and a hydrophilic polymer layer provided on an inner side of the hydrophilic polymer layer, and a plurality of the metal columns may be provided between the hydrophobic polymer layer and the hydrophilic polymer layer.

In this configuration, the metal column may be a multi-particle member.

In this configuration, a material of the metal column may have a melting point equal to or higher than a melting point of a material of the polymer layer.

The present invention also provides a semiconductor device including: a first substrate and a second substrate which are stacked; a plurality of first electrodes provided on a surface of the first substrate facing the second substrate; a plurality of second electrodes provided on a surface of the second substrate facing the first substrate; a plurality of bumps that connect the plurality of first electrodes and the plurality of second electrodes, respectively; a first circuit provided in the first substrate so as to be electrically connected to the plurality of first electrodes; a second circuit provided in the second substrate so as to be electrically connected to the plurality of second electrodes; a detection circuit that detects a second electrode of the plurality of second electrodes to which at least one first electrode of the plurality of first electrodes is connected; and a switching circuit that switches at least one of connection between the first circuit and the plurality of first electrodes and connection between the second circuit and the plurality of second electrodes on the basis of a detection result of the detection circuit.

The present invention also provides a method for manufacturing semiconductor devices including: a step of filling a mixture containing metal particles and polymers in a guide; and a step of subjecting the mixture to a heat treatment so that the polymers agglomerate to the guide to form a polymer layer that makes contact with the guide and the metal particles agglomerate away from the guide with the polymer layer interposed therebetween to form a metal column that stretches in a stretching direction of the guide from the metal particles.

In this configuration, the method may further include a step of disposing a second substrate on a first substrate, and the step of subjecting to the heat treatment may include a step of forming the metal column as a bump that electrically connects the first and second substrates.

In this configuration, the step of filling the mixture may include a step of forming the mixture on at least one surface of the first and second substrates so that the mixture is filled in the guide formed in the at least one surface of the first and second substrates.

In this configuration, the method may further include a step of forming a through-hole so as to pass through a semiconductor substrate; and a step of forming an insulating film as the guide on an inner surface of the through-hole, and the step of filling the mixture may be a step of filling the mixture in the through-hole, and the metal column may be a penetration electrode that passes through the polymer layer.

In this configuration, the guide may be hydrophilic and the polymers may include at least hydrophilic polymers.

In this configuration, the polymers may include hydrophilic polymers and hydrophobic polymers, and in the step of subjecting the mixture to the heat treatment, the hydrophilic polymers may agglomerate to the guide and the hydrophobic polymers may agglomerate away from the guide.

In this configuration, the guide may be hydrophobic, and the polymers may include at least hydrophobic polymers.

In this configuration, the polymers may include hydrophilic polymers and hydrophobic polymers, and in the step of subjecting the mixture to the heat treatment, the hydrophobic polymers may agglomerate to the guide and the hydrophilic polymers may agglomerate away from the guide.

In this configuration, the step of subjecting the mixture to the heat treatment may be a step of subjecting the mixture to a heat treatment at a higher temperature than a melting point of the polymers.

A method for manufacturing semiconductor devices according to the present invention may include a step of filling a mixture containing metal particles and polymers between a pair of guides that extends in a horizontal direction; and a step of subjecting the mixture to a heat treatment so that the polymers agglomerate to the guides to form a polymer layer that makes contact with the guides and the metal particles agglomerate away from the guides with the polymer layer interposed therebetween to form a metal column that stretches in a horizontal direction from the metal particles. In this case, it is possible to obtain a semiconductor device including a metal column that stretches in a horizontal direction; a polymer layer that sandwiches the metal column from a direction crossing the stretching direction; and a pair of guides that sandwiches the metal column and the polymer layer in the crossing direction so as to be spaced from the metal column with the polymer layer interposed therebetween. Moreover, it is possible to easily form metal columns that extend in the horizontal direction.

Moreover, a method for manufacturing semiconductor devices according to the present invention may include: a step of forming a metal film on a surface of a pair of guides that extends in a horizontal direction; a step of filling a mixture containing metal particles and polymers between the guides; and a step of subjecting the mixture to a heat treatment so that the metal particles agglomerate to the guides to form a metal column that stretches in a stretching direction of the guides so as to make contact with the guides and the polymers agglomerate away from the guides with the metal column interposed therebetween to form a polymer layer that stretches in the stretching direction of the guides. In this case, it is possible to obtain a semiconductor device including: a polymer layer that stretches in a stretching direction; a metal column that sandwiches the polymer layer from a direction crossing the stretching direction; and a pair of guides that sandwiches the metal column and the polymer layer in the crossing direction so as to be spaced from the polymer layer with the metal column interposed therebetween. Moreover, it is possible to form metal columns at a narrower interval and to narrow the interval of metal wirings formed from the metal columns. Furthermore, the method may preferably include a step of removing a metal film exposed to the surface of the respective guides.

When the guides are provided on the surface of a substrate or the like, by forming the metal film so as to cover the surface of the substrate or the like and the surface of the respective guides and forming a guide layer on the metal film between the guides at an interval from the guides, it is possible to allow the polymers to agglomerate in the range of the guide layer to form a polymer layer that separates the metal columns.

Moreover, a method for manufacturing semiconductor devices according to the present invention may include: a step of forming a pair of guides of which the inner portion is formed of metal and of which the surface is covered by a hydrophilic or hydrophobic thin film, the guides extending in a horizontal direction; a step of filling a mixture containing metal particles and polymers between the guides; and a step of subjecting the mixture to a heat treatment so that the polymers agglomerate to the guides to form a polymer layer that makes contact with the guides and the metal particles agglomerate away from the guides with the polymer layer interposed therebetween to form a metal column that stretches in the stretching direction of the guides from the metal particles. In this case, it is possible to obtain a semiconductor device including: a metal column that stretches in a stretching direction; a polymer layer that sandwiches the metal column from a direction crossing the stretching direction; and a pair of guides of which the inner portion is formed of metal and which sandwiches the metal column and the polymer layer in the crossing direction so as to be spaced from the metal column with the polymer layer interposed therebetween. Moreover, by using the metallic portion of the inner portion of each guide and the metal column as metal wirings, it is possible to form metal wirings at a narrower interval. Furthermore, the method may preferably include a step of removing a thin film exposed to the surface of each guide.

In the method for manufacturing semiconductor devices according to the present invention, the step of subjecting the mixture to the heat treatment may be performed after a plurality of planar supports in which a plurality of guides is provided on a surface and the mixture is filled between the guides are stacked. In this case, it is possible to obtain a semiconductor device formed by stacking a plurality of planar supports in which one or a plurality of the metal columns, one or a plurality of the polymer layers, and a plurality of the guides are provided so as to stretch along a surface in a vertical direction to the surface. Moreover, it is possible to form metal columns at a time in respective layers in which the supports are stacked. The method may include a step of removing the formed polymer layers after the heat treatment. In this way, it is possible to form multilayer wirings.

Effects of the Invention

According to the present invention, it is possible to miniaturize metal columns.

BRIEF DESCRIPTION OF DRAWINGS

FIGS. 4(a) and 4(b) are diagrams illustrating a method for forming metal columns according to Modification 2 of Embodiment 2.

FIGS. 18(a) and 18(b) are cross-sectional views before and after a heat treatment is performed, respectively, illustrating a method for forming metal columns according to Embodiment 8.

FIGS. 19(a) and 19(b) are cross-sectional views before and after a heat treatment is performed, respectively, illustrating a method for forming metal columns according to a modification of Embodiment 8.

MODE FOR CARRYING OUT THE INVENTION

Hereinafter, embodiments of the present invention will be described with reference to the drawings.

Embodiment 1

Figure 1A:
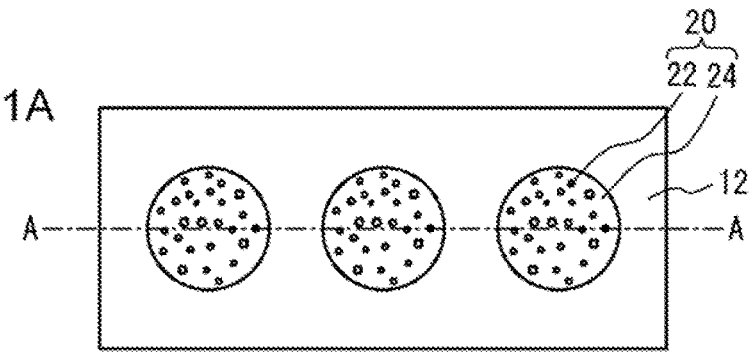
FIGS. 1(a) to 1(d) are diagrams for describing a method for forming metal columns according to Embodiment 1.
Figure 1B:
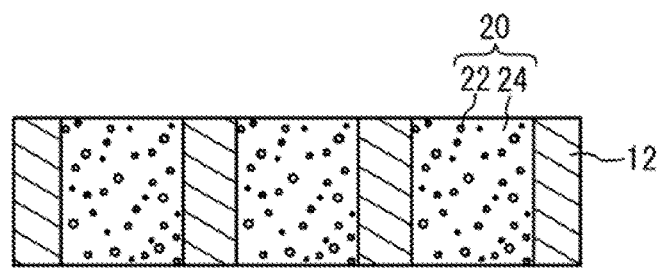
Figure 1C:
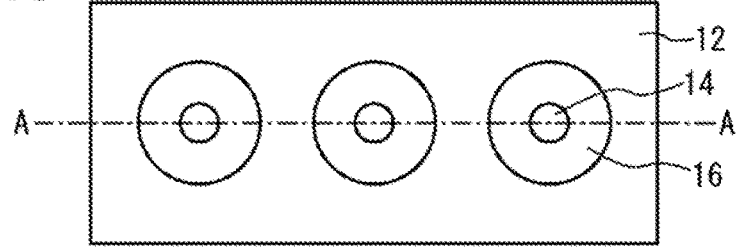
Figure 1D:
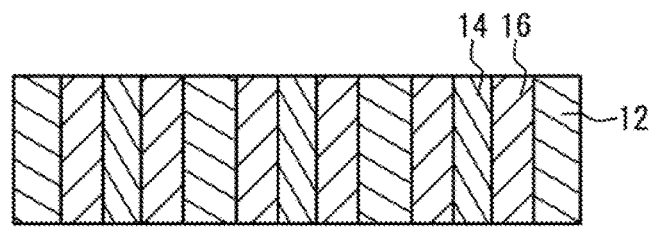

FIGS. 1(a) to 1(d) are diagrams for describing a method for forming metal columns according to Embodiment 1. FIGS. 1(a) and 1(c) are plan views and FIGS. 1(b) and 1(d) are cross-sectional views along A-A in FIGS. 1(a) and 1(c), respectively.

As illustrated in FIGS. 1(a) and 1(b), a mixture 20 containing metal particles 22 and polymers 24 is filled in a guide 12. The guide 12 has hydrophilic or hydrophobic properties. As examples of the guide 12 having hydrophilic properties, inorganic insulators such as silicon oxides or silicon nitrides or metal can be used. As examples of the guide 12 having hydrophobic properties, an organic insulating film such as a hydrophobic polymer can be used. The guide 12 may be a film formed on a substrate or the like. The guide 12 may be a surface of a substrate which is subjected to hydrophilic or hydrophobic treatment. For example, although the surface of silicon is hydrophobic, when the surface of the silicon is oxidized to form a silicon oxide film, the surface has hydrophilic properties.

In the mixture 20, the metal particles 22 are dispersed in the polymers 24. The metal particles 22 are low-resistance metal such as gold (Au), copper (Cu), silver (Ag), or alloys containing these materials. Moreover, the metal particles 22 may be made from carbon nanotubes. Furthermore, the metal particles 22 are low-melting point metal such as tin (Sn), indium (In), or alloys containing these materials. The metal particles 22 are nanoparticles, for example, and have a diameter of approximately 1 nm to 100 nm. A number of metal particles 22 dispersed in the mixture 20 may be made from one kind of metal and may be made from a plurality of kinds of metal, and metal particles and carbon nanotubes may be mixed together. The content of the metal particles 22 in the mixture 20 is preferably between 1 and 50 vol. %.

As examples of the polymers 24, addition polymerization-type polymers such as styrene-based polymers, (meth) acrylic ester-based polymers, vinyl-based polymers, or diene-based polymers can be used. Furthermore, polycondensation-type polymers such as urea-based polymers, imide-based polymers, or amide-based polymers can be used. Furthermore, polyaddition-type polymers such as urethane-based polymers, epoxy-based polymers, or benzocyclobutenes can be used. Moreover, mixtures thereof can be used.

More specifically, the polymers 24 are organic polymers such as polystyrene (PS) or polymethylmethacrylate (PMMA), for example. Moreover, as examples of the polymers 24, polyolefins (for example, polyethylene or polypropylene), polyalkylene oxides (for example, polyethylene oxides), polypropylene oxides, polybutylene oxides, polyethers, poly(meth)acrylates, polystyrenes, polyesters, polyorganosiloxanes, polyorganogermanes, or mixtures thereof can be used.

As the polymers 24, those exemplified in Patent Documents 1 and 2 or other polymers other than those described above can be used. The polymers 24 may contain particles such as fillers. The particles contained in the polymers 24 are inorganic insulating materials having a low thermal expansion coefficient such as silicon oxides, for example. When the guide 12 is hydrophilic, the polymers 24 preferably contain at least hydrophilic polymers. When the guide 12 is hydrophobic, the polymers 24 preferably contain at least hydrophobic polymers. The hydrophilic or hydrophobic properties of polymers can be controlled by the presence of polarization and a hydrophilic or hydrophobic group of the polymers 24 and/or the molecular weight or the like of the polymers 24.

A contact angle is broadly used as an indicator indicating the hydrophilic and hydrophobic properties. That is, the smaller the contact angle, the higher the hydrophilic properties, whereas the larger the contact angle, the higher the hydrophobic properties. For example, the contact angle of the polymer examples of the polymers 24 is approximately 90 degrees for styrene-based polymers, approximately 70 degrees for (meth)acrylic ester-based polymers, approximately 90 degrees for vinyl-based polymers, approximately 80 degrees for urea-based polymers, 75 to 90 degrees for imide-based polymers, 50 to 70 degrees for amide-based polymers, 80 to 95 degrees for urethane-based polymers, approximately 90 degrees for epoxy-based polymers, and approximately 90 degrees for benzocyclobutenes. In the present specification, "hydrophilic" and "hydrophobic" merely represents relative properties.

As illustrated in FIGS. 1(c) and 1(d), the mixture 20 is subjected to a heat treatment. In this way, the metal particles 22 and the polymers 24 are phase-separated. In this case, the polymers 24 agglomerate to the guide 12. In this way, polymer layers 16 that make contact with the guide 12 are formed from the agglomerated polymers 24. Since the polymers 24 agglomerate to the guide 12, the metal particles 22 agglomerate away from the guide 12. In this way, metal columns 14 spaced from the guide 12 with the polymer layers 16 interposed therebetween are formed from the agglomerated metal particles 22. In this manner, the polymers 24 and the metal particles 22 are self-organized and the metal columns 14 are formed in the polymer layers 16. The metal columns 14 extend in a stretching direction of the guide 12. When the guide 12 is hydrophilic and the polymers 24 contain hydrophilic polymers, the polymers 24 are likely to agglomerate so as to make contact with the guide 12. In this way, a region of the polymer layer 16 making contact with the guide 12 is hydrophilic. When the guide 12 is hydrophobic and the polymers 24 contain hydrophobic polymers, the polymers 24 are likely to agglomerate so as to make contact with the guide 12. In this way, a region of the polymer layer 16 making contact with the guide 12 is hydrophobic. In this manner, in order to allow the polymers 24 to agglomerate so as to make contact with the guide 12 and to efficiently form the metal columns 14 in the polymer layers 16, it is preferable that the contact angle of the polymers 24 is similar to the contact angle of the material of the guide 12.

Melted metal has higher polarizability than hydrophilic polymers. Polymers having high polarizability have high hydrophilic properties, and substance having high hydrophilic properties are easily phase-separated from substance having low hydrophilic properties. Therefore, hydrophobic polymers are more easily phase-separated from melted metal than hydrophilic polymers. Therefore, when the metal particles 22 melt, it is preferable that the guide 12 has hydrophobic properties and the polymers 24 contain hydrophobic polymers. Moreover, the hydrophilic guide 12 can be easily formed using an inorganic insulating film or the like. Therefore, the guide 12 may be hydrophilic and the polymers 24 may contain hydrophilic polymers.

In semiconductor devices formed in this manner, the polymer layer 16 surrounds the metal column 14 from a direction crossing the stretching direction. The guide 12 is spaced from the metal column 14 with the polymer layer 16 interposed therebetween and surrounds the polymer layer 16 from the direction crossing the stretching direction. The guide 12 may not be formed so as to surround the polymer layer 16 completely. That is, in FIG. 1(c), a portion of the guide that surrounds the polymer layer 16 may be hydrophobic and another portion may be hydrophilic. In FIG. 1(d), a portion of the guide that surrounds the polymer layer 16 may be hydrophobic and another portion may be hydrophilic.

According to Embodiment 1, the polymers 24 agglomerate to the guide 12 to form the polymer layers 16, and the metal particles 22 agglomerate away from the guide 12 to form the metal columns 14. In this way, the metal columns 14 are formed to be spaced from the guide 12. Therefore, it is possible to decrease the diameter of the metal columns 14 and/or the interval of the metal columns 14. In this manner, miniaturization of the metal columns 14 is realized. By miniaturizing the metal columns 14, it is possible to reduce the capacitance of the wires. The diameter and the interval of the metal columns 14 can be set between 0.1 μm and 10 μm, for example. For miniaturization of the metal columns 14, the diameter and the interval of the metal columns 14 are preferably equal to or smaller than 1 μm. The height of the metal columns 14 can be set between 1 μm and 100 μm, for example. For example, it is possible to form the metal columns 14 having an aspect ratio of 10 or larger.

The heat treatment temperature may be set to such a temperature that the metal particles 22 and the polymers 24 are phase-separated. For example, the heat treatment temperature can be set between 150° C. and 300° C. More preferably, the heat treatment temperature is between 200° C. and 250° C. In order to realize phase-separation, the heat treatment temperature is preferably higher than the melting point of the polymers 24.

A material having a lower melting point than the heat treatment temperature (for example, a material having a lower melting point than the polymers 24) can be used as the metal particles 22. In this case, when the heat treatment temperature is higher than the melting point of the metal particles 22, the metal columns 14 melt. Due to this, fine holes are not formed in the metal columns 14. In order to melt the metal particles 22, the melting point of the metal columns 14 is preferably equal to or lower than the melting point of the polymer layer 16 but may be higher than the melting point of the polymer layer 16. When a material having a higher melting point than the heat treatment temperature is used as the metal particles 22, the metal columns 14 form multi-particle bodies having fine holes in which the metal particles 22 agglomerate and make contact with each other.

Embodiment 2

Figure 2A:
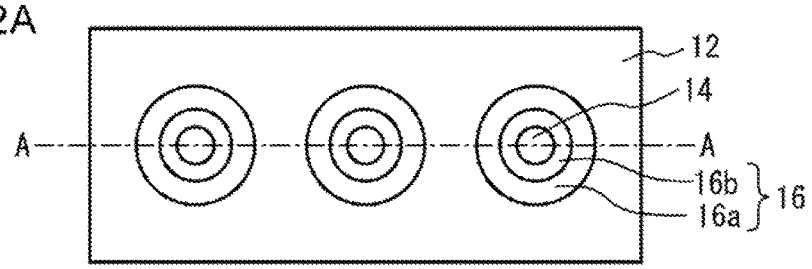
FIGS. 2(a) and 2(b) are diagrams illustrating a method for forming metal columns according to Embodiment 2.
Figure 2B:
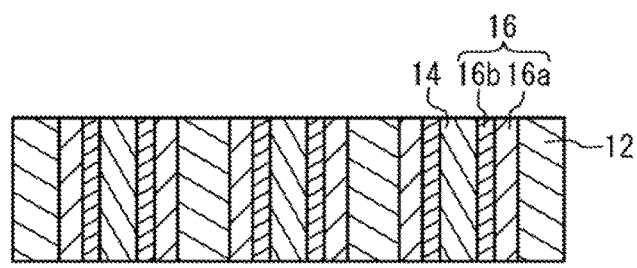

Embodiment 2 is an example in which a mixture of hydrophilic polymers and hydrophobic polymers is used as the polymers 24. FIGS. 2(*a*) and 2(*b*) are diagrams illustrating a method for forming metal columns according to Embodiment 2. FIG. 2(*a*) is a plan view and FIG. 2(*b*) is a cross-sectional view taken along A-A in FIG. 2(*a*). In FIGS. 2(*a*) and 2(*b*) of Embodiment 2, a mixture of hydrophilic polymers and hydrophobic polymers is used as the polymers 24. Hydrophobic polymers have hydrophobic properties as compared to hydrophilic polymers. The hydrophilic polymers and the hydrophobic polymers are polymers that do not mix with each other. The hydrophilic polymers and the hydrophobic polymers can be appropriately selected according to the presence of polarization and a hydrophilic or hydrophobic group of the polymers 24 and/or the molecular weight or the like of the polymers.

As illustrated in FIGS. 2(*a*) and 2(*b*), when the mixture is subject to a heat treatment, the hydrophilic polymers, the hydrophobic polymers, and the metal particles are phase-separated. When the guide 12 is hydrophilic, the hydrophilic polymers agglomerate to the guide 12, and a first polymer layer 16*a* formed close to the guide 12 is a hydrophilic polymer layer. The hydrophobic polymers agglomerate away from the guide 12, and a second polymer layer 16*b* which is a hydrophobic polymer layer is formed on an inner side of the first polymer layer 16*a*. The metal particles 22 agglomerate to the inner side of the hydrophobic polymers and the metal column 14 is formed on the inner side of the second polymer layer 16*a*. When the guide 12 is hydrophobic, the hydrophobic polymers agglomerate to the guide 12 and the hydrophilic polymers agglomerate away from the guide 12. In this way, configurations other than the configuration in which the first polymer layer 16*a* is a hydrophobic polymer layer and the second polymer layer 16*b* is a hydrophilic polymer layer are the same as those of Embodiment 1, and the description thereof will be omitted.

Figure 3A:
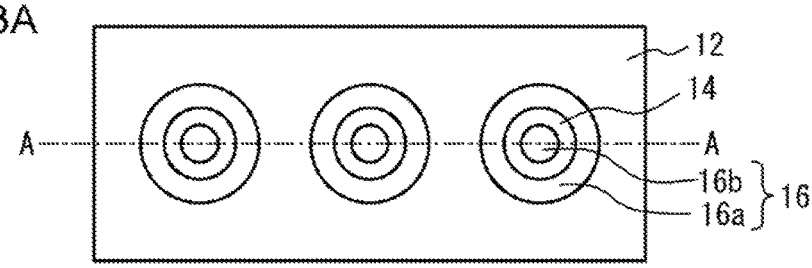
FIGS. 3(a) and 3(b) are diagrams illustrating a method for forming metal columns according to Modification 1 of Embodiment 2.
Figure 3B:
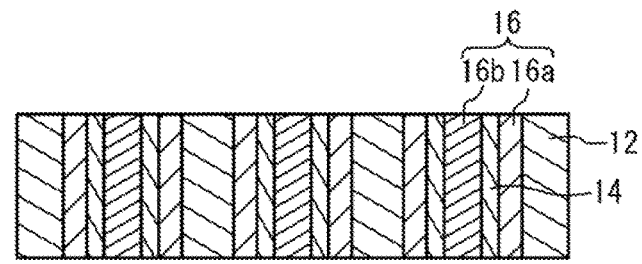

FIGS. 3(*a*) and 3(*b*) are diagrams illustrating a method for forming metal columns according to Modification 1 of Embodiment 2. FIG. 3(*a*) is a plan view and FIG. 3(*b*) is a cross-sectional view taken along A-A in FIG. 3(*a*). In Modification 1 of Embodiment 2, as illustrated in FIGS. 3(*a*) and 3(*b*), the metal column 14 is formed on the inner side of the first polymer layer 16*a*. The second polymer layer 16*b* is formed on the inner side of the metal column 14. In this manner, the metal column 14 is formed between the first polymer layer 16*a* and the second polymer layer 16*b* in a ring form. The other configuration is the same as Embodiment 2, and the description thereof will be omitted.

FIGS. 4(*a*) and 4(*b*) are diagrams illustrating a method for forming metal columns according to Modification 2 of Embodiment 2. FIG. 4(*a*) is a plan view and FIG. 4(*b*) is a cross-sectional view taken along A-A in FIG. 4(*a*). In Modification 2 of Embodiment 2, as illustrated in FIGS. 4(*a*) and 4(*b*), a plurality of metal columns 14 is formed between the first polymer layer 16*a* and the second polymer layer 16*b*. The other configuration is the same as Modification 1 of Embodiment 2, and the description thereof will be omitted.

According to Embodiment 2 and the modifications thereof, the polymers 24 contain hydrophilic polymers and hydrophobic polymers. Due to this, when the guide 12 is hydrophilic, the hydrophilic polymers agglomerate to the guide 12 and the hydrophobic polymers agglomerate away from the guide 12 during a heat treatment. Therefore, the first polymer layer 16*a* is a hydrophilic polymer layer and the second polymer layer 16*b* is a hydrophobic polymer layer. When the guide 12 is hydrophobic, the first polymer layer 16*a* is a hydrophobic polymer layer and the second polymer layer 16*b* is a hydrophilic polymer layer. In this manner, when hydrophilic polymers and hydrophobic polymers are phase-separated, since the metal particles 22 are also phase-separated, the metal particles 22 agglomerate more easily than Embodiment 1. Therefore, it is possible to form the metal columns 14 with high accuracy.

When the metal particles 22 melt, melted metal is more easily phase-separated from hydrophobic polymers than hydrophilic polymers. Therefore, the guide 12 is preferably hydrophilic and the first polymer layer 16*a* is preferably a hydrophilic polymer layer. Due to this, the metal columns 14 are formed by phase-separation between hydrophobic polymers and melted metal. Therefore, it is possible to form the metal columns 14 with higher accuracy.

As with Embodiment 2, the metal columns 14 may be provided on the inner side of the second polymer layer 16*b*. In this way, it is possible to decrease the diameter of the metal columns 14. As with Modification 1 of Embodiment 2, the metal column 14 may be provided between the first polymer layer 16*a* and the second polymer layer 16*b* in a ring form. As with Modification 2 of Embodiment 2, a plurality of metal columns 14 may be provided between the first polymer layer 16*a* and the second polymer layer 16*b*. In this way, it is possible to further decrease the interval of the metal columns 14.

Which one of Embodiment 2 and the modifications thereof will be selected can be appropriately set according to the material and/or the particle size, and the heat treatment conditions of the metal particles 22 such as the material and/or the molecular content of the hydrophilic polymers and the hydrophobic polymers. For example, when the hydrophobic polymers have weak hydrophobic properties, such metal columns 14 as described in Embodiment 2 can be formed. When the hydrophobic polymers have strong hydrophobic properties, such metal columns 14 as described in Modification 1 of Embodiment 2 can be formed. By forming a plurality of electrodes which serves as seeds on the mixture 20, it is possible to form such metal columns 14 as described in Modification 2 of Embodiment 2.

Embodiment 3

Figure 5A:
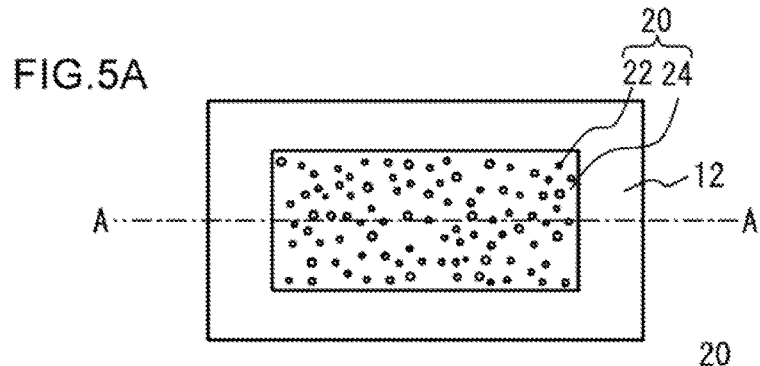
FIGS. 5(a) to 5(e) are diagrams illustrating a method for forming metal columns according to Embodiment 3.
Figure 5B:
Figure 5C:
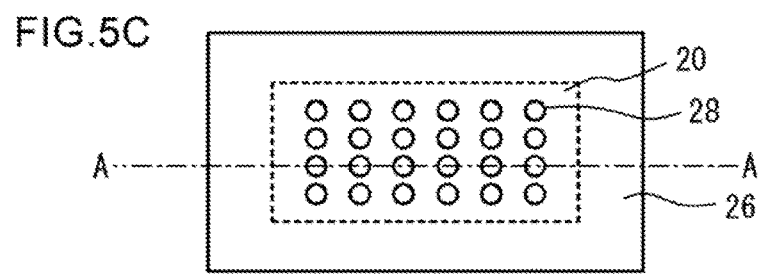
Figure 5D:
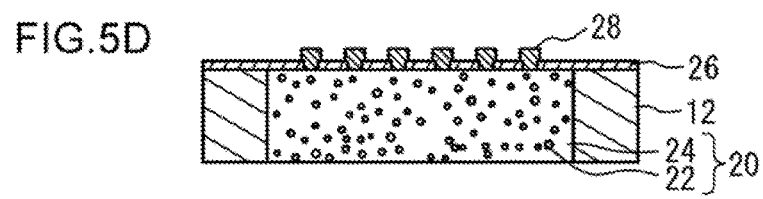
Figure 5E:
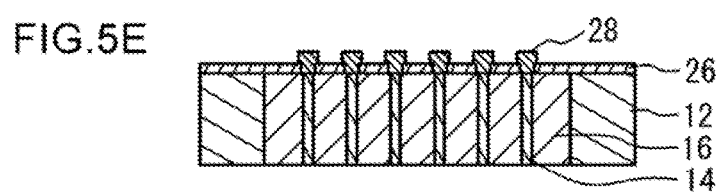

Embodiment 3 is an example of forming a plurality of metal columns 14 in the guide 12 and is an example of a via-middle method. FIGS. 5(a) to 5(e) are diagrams illustrating a method for forming metal columns according to Embodiment 3. FIGS. 5(a) and 5(c) are plan views, FIGS. 5(b) and 5(d) are cross-sectional views taken along A-A in FIGS. 5(a) and 5(c), respectively, and FIG. 5(e) is a cross-sectional view corresponding to the cross-sectional views taken along A-A of FIGS. 5(a) and 5(c).

As illustrated in FIGS. 5(a) and 5(b), a mixture 20 is filled in a guide 12. As illustrated in FIGS. 5(c) and 5(d), an insulating film 26 having a plurality of openings is formed on the guide 12 and the mixture 20. The insulating film 26 is an inorganic insulating film such as silicon oxides or silicon nitrides or an organic insulating film such as a resin, for example. A plurality of electrodes 28 is formed so as to make contact with the mixture 20 through the plurality of openings of the insulating film 26. The electrode 28 is a metal layer such as gold, copper, nickel (Ni), or titanium (Ti), for example. The mixture 20 may be filled in the guide 12 after the insulating film 26 and the electrode 28 are formed.

As illustrated in FIG. 5(e), the mixture 20 is subjected to a heat treatment. The metal particles 22 agglomerate using the plurality of electrodes 28 as seeds to form a plurality of metal columns 14. The other configuration is the same as Embodiment 1, and the description thereof will be omitted.

According to Embodiment 3, a plurality of metal columns 14 is formed in the guide 12. In this way, even when the guide 12 is miniaturized, miniaturization of the metal columns 14 can be realized. Particularly, it is possible to decrease the interval of the metal columns 14. The arrangement of the metal columns 14 can be set arbitrarily according to the arrangement of the electrodes 28.

Moreover, since the electrodes are in contact with the mixture 20, a plurality of metal columns 14 are formed so as to make contact with the plurality of electrodes 28, respectively. Since the insulating film 26 is formed between the electrodes 28 so as to make contact with the mixture 20, the metal column 14 is not formed between the electrodes 28. Due to this, it is possible to further decrease the interval of the plurality of metal columns 14.

When the metal column 14 is metal having a low melting point such as tin or indium, the electrode 28 is preferably formed of a material having a higher melting point than the metal column 14 so that the electrode 28 does not melt during a heat treatment. The electrode 28 is preferably nickel so that the electrode functions as a seed of tin or indium. When the metal column 14 is metal having a high melting point such as gold or silver, since the electrode 28 does not melt during a heat treatment, the electrodes 28 may be the same material as the metal column 14.

When the electrode 28 is used as a seed when forming the metal column 14, the guide 12 may not be provided. Moreover, the hydrophilic or hydrophobic properties of the guide 12 may not correspond to that of the polymers.

Embodiment 4

Embodiment 4 is an example in which the metal column 14 is used as a penetration electrode that passes through a semiconductor substrate and is an example of a via-last method. FIGS. 6(a) to 6(e) are cross-sectional views illustrating a method for manufacturing semiconductor devices according to Embodiment 4.

Figure 6A:
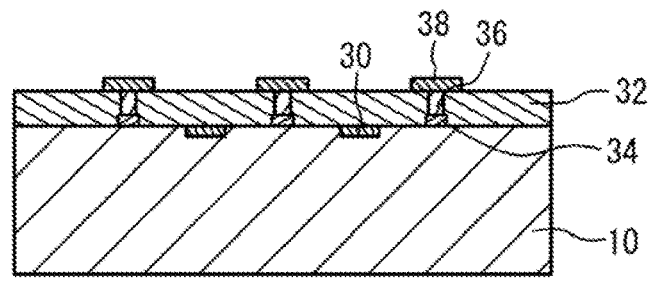
FIGS. 6(a) to 6(e) are cross-sectional views illustrating a method for manufacturing semiconductor devices according to Embodiment 4.

As illustrated in FIG. 6(a), transistor regions 40 including transistor and the like are formed on the semiconductor substrate 10. The semiconductor substrate 10 is a single crystal silicon substrate, for example. Electrodes 34 are formed on the semiconductor substrate 10. The electrodes 34 are metal layers such as copper layers or nickel layers, for example. A multilayer wiring 32 is formed on the semiconductor substrate 10. The multilayer wiring 32 is a structure in which a plurality of insulating layers and a plurality of wiring layers are alternately stacked. The insulating layer is a silicon oxide layer, for example, and the wiring layer is a conductive layer such as a copper layer. The multilayer wiring 32 and the transistors and the like in the transistor regions 30 form a circuit. Electrodes 38 are formed on the multilayer wiring 32. The electrodes 38 are conductive layers such as copper layers. The electrodes 38 and 34 are electrically connected by wirings 36 in the multilayer wiring 32. Bumps and the like may be formed on the electrode 38. The electrodes 34 may be electrically connected to the transistors in the transistor regions 30.

Figure 6B:
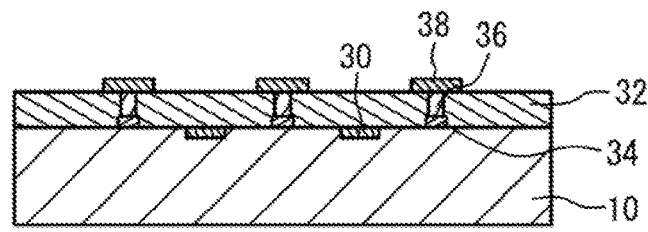

As illustrated in FIG. 6(b), the lower surface of the semiconductor substrate 10 is ground. In this way, the semiconductor substrate 10 is thinned to a thickness between approximately 10 µm and 100 µm, for example.

Figure 6C:
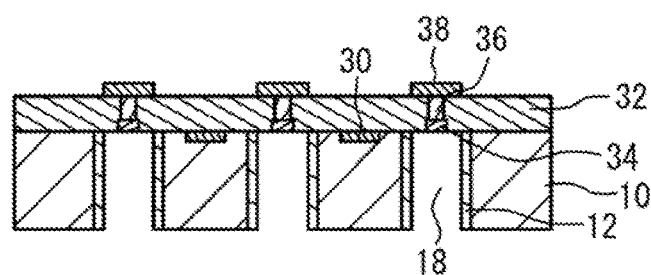

As illustrated in FIG. 6(c), holes 18 are formed so as to pass through the semiconductor substrate 10 from the lower surface of the semiconductor substrate 10. The holes 18 are formed using a deep reactive ion etching (RIE) method. The guide 12 is formed on the inner surface of the hole 18. The diameter of the hole 18 is between 1 µm and 10 µm, for example. For example, the semiconductor substrate 10 is thermally oxidized to form the guide 12 formed of a silicon oxide film. An insulating film such as a silicon oxide film may be formed as the guide 12 using a chemical vapor deposition (CVD) method, for example. In this way, the guide 12 having hydrophilic properties is formed. Moreover, an organic insulating film such as polymers may be formed on the inner surface of the hole 18 as the guide 12. For example, the guide 12 of hydrophobic polyimide can be formed by polymerizing pyromellitic dianhydride (PMDA) and oxydianiline (ODA).

Figure 6D:
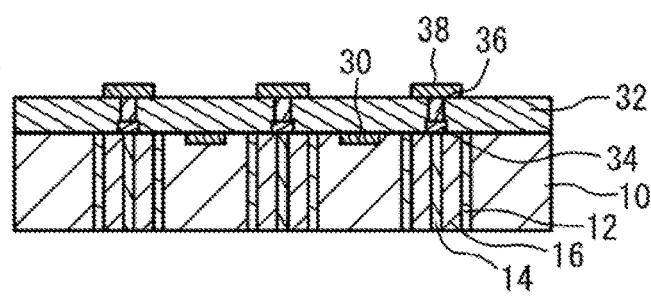
Figure 6E:
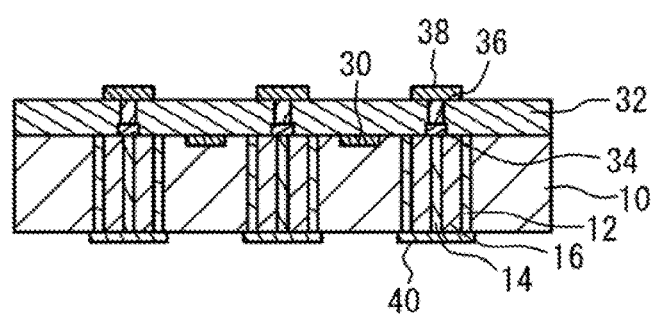

As illustrated in FIG. 6(d), the polymer layer 16 and the metal column 14 are formed in the hole 18 using the method for forming metal columns according to Embodiments 1 and 2 and the modifications thereof. As illustrated in FIG. 6(e), electrodes 40 electrically connected to the metal columns 14 are formed on the lower surface of the semiconductor substrate 10. The electrodes 40 are metal layers such as copper layers, for example. The metal columns 14 function as penetration electrodes that electrically connect the electrodes 34 and 40. The diameter of the metal column 14 is between 0.1 µm and several µm, for example.

Figure 7A:
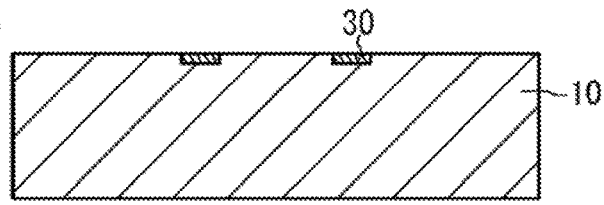
FIGS. 7(a) to 7(e) are cross-sectional views illustrating a method for manufacturing semiconductor devices according to Modification 1 of Embodiment 4.

Modification 1 of Embodiment 4 is an example of a via-middle method. FIGS. 7(a) to 7(e) are cross-sectional views illustrating a method for manufacturing semiconductor devices according to Modification 1 of Embodiment 4. As illustrated in FIG. 7(a), the transistor regions 30 are formed on the upper surface of the semiconductor substrate 10.

Figure 7B:
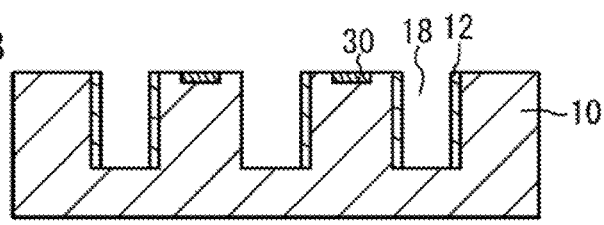
Figure 7C:
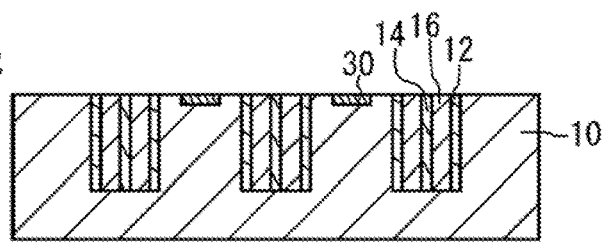
Figure 7D:
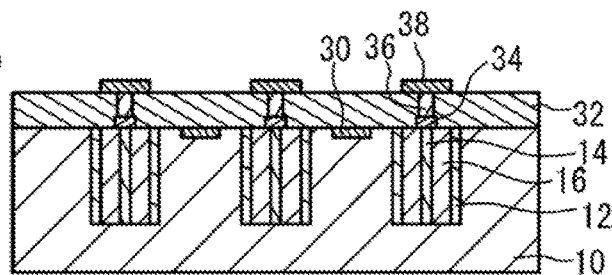
Figure 7E:
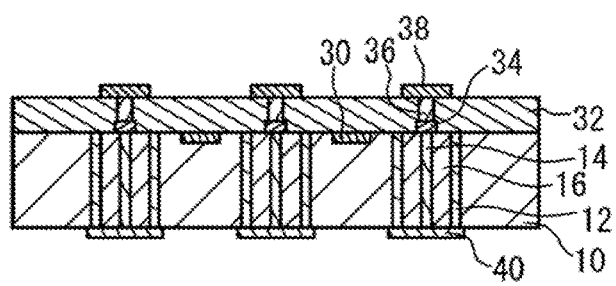

As illustrated in FIG. 7(b), the holes 18 are formed from the upper surface of the semiconductor substrate 10. The guide 12 is formed in the inner surface of the hole 18. As illustrated in FIG. 7(c), the polymer layer 16 and the metal column 14 are formed in the holes 18 using the method for forming metal columns according to Embodiments 1 and 2 and the modifications thereof. As illustrated in FIG. 7(d), the electrodes 34, the multilayer wiring 32, and the electrodes 38 are formed on the upper surface of the semiconductor substrate 10. As illustrated in FIG. 7(e), the lower surface of the semiconductor substrate 10 is ground so that the metal columns 14 are exposed. The electrodes 40 electrically connected to the metal columns 14 are formed on the lower surface of the semiconductor substrate 10. The other configuration is the same as Embodiment 4, and the description thereof will be omitted.

Figure 8A:
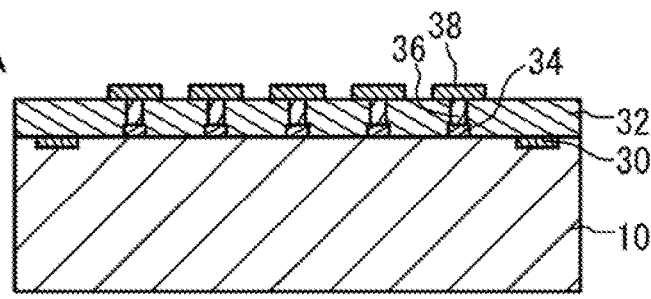
FIGS. 8(a) to 8(d) are cross-sectional views illustrating a method for manufacturing semiconductor devices according to Modification 2 of Embodiment 4.

Modification 2 of Embodiment 4 is an example of forming a plurality of metal columns 14 in the hole 18. FIGS. 8(a) to 8(d) are cross-sectional views illustrating a method for manufacturing semiconductor devices according to Modification 2 of Embodiment 4. As illustrated in FIG. 8(a), transistor regions 30 are formed on the upper surface of the semiconductor substrate 10 and the multilayer wiring 32 is formed on the upper surface of the semiconductor substrate 10. The wirings 36 in the multilayer wiring 32 electrically connect the electrodes 34 and 38. The plurality of electrodes 34 are formed on the upper surface of the semiconductor substrate 10 so as to be adjacent to each other.

Figure 8B:
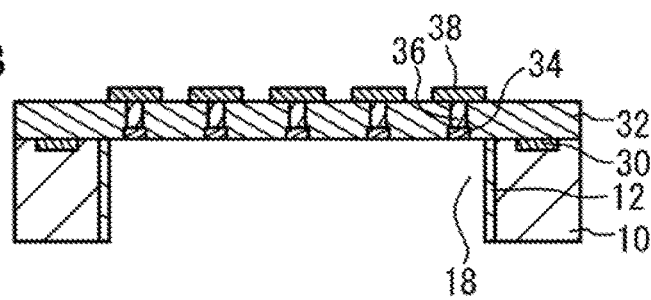

As illustrated in FIG. 8(b), the lower surface of the semiconductor substrate 10 is ground. Holes 18 that pass through the semiconductor substrate 10 are formed from the lower surface of the semiconductor substrate 10 so that the plurality of adjacent electrodes 34 are exposed. The guide 12 is formed on the inner surface of the hole 18.

Figure 8C:
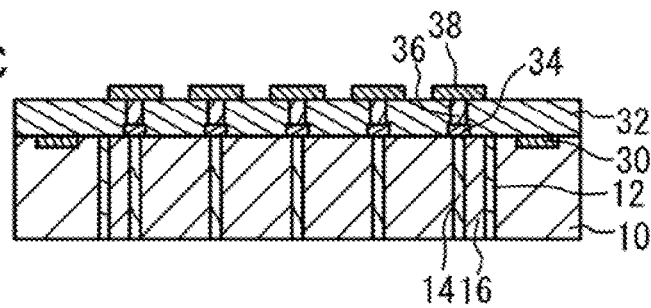
Figure 8D:
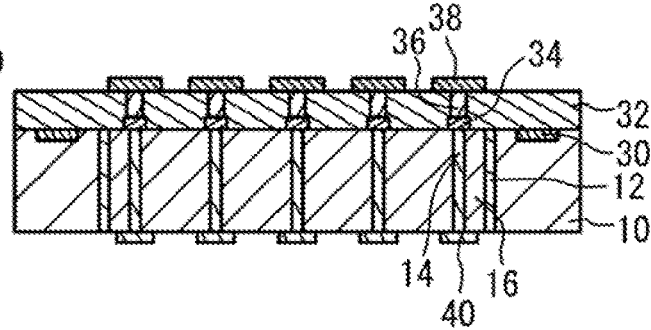

As illustrated in FIG. 8(c), a plurality of metal columns 14 and a plurality of polymer layers 16 are formed in the hole 18 using the method for forming metal columns according to Embodiment 3. The metal columns 14 are formed so as to make contact with the electrodes 34. The metal columns 14 can be formed in an arbitrary arrangement by setting the arrangement of the electrodes 34. As illustrated in FIG. 8(d), the electrodes 40 that make contact with the metal columns 14 are formed. The interval of the metal columns 14 is between 0.1 μm and several μm, for example. The other configuration is the same as Embodiment 4, and the description thereof will be omitted.

According to Embodiment 4 and the modification thereof, the hole 18 that serves as the through-hole that passes through the semiconductor substrate 10 is formed as illustrated in FIGS. 6(c), 7(b), and 8(b). The input interface as the guide 12 is formed on the inner surface of the hole 18 as illustrated in FIGS. 6(c), 7(b), and 8(b). A mixture is filled in the hole 18 as illustrated in FIGS. 6(d), 7(c), and 8(c). After that, the metal columns 14 as the penetration electrodes that pass through the polymer layer 16 are formed using Embodiments 1 and 3 and the modifications thereof.

When the penetration electrodes that pass through the semiconductor substrate 10 are formed, it is difficult to form fine penetration electrodes having a high aspect ratio at a low cost. For example, an insulating film is formed in the hole. The insulating film is made relatively thick to suppress short-circuiting between the penetration electrode and the semiconductor substrate. A barrier layer and a seed layer are formed in the insulating film. After that, the penetration electrodes are formed using a plating method. In this method, the number of manufacturing steps increases and the manufacturing cost increases. Moreover, it is difficult to form the insulating film, the barrier layer, and the seed layer in a hole having a high aspect ratio.

In Embodiment 4 and the modification thereof, the polymer layer 16 functions as an insulating film for suppressing short-circuiting between the penetration electrode and the semiconductor substrate, and the guide 12 is used for making the inner surface of the hole 18 hydrophilic or hydrophobic. Due to this, the insulating film used as the guide 12 may be thin. The polymer layer 16 can be made thick to form the polymer layer 16 by self-organization. Since the polymer layer 16 can be made thick, it is possible to increase the aspect ratio of the penetration electrode as compared to the aspect ratio of the hole 18. In this way, it is possible to form fine penetration electrodes having a high aspect ratio at a low cost.

It is not desirable that heat at which the polymer layer 16 melts is applied after the metal columns 14 are formed. For example, it is not desirable that heat of 300° C. or higher is applied to the polymer layer 16. In Embodiment 4, the metal columns 14 are formed after the multilayer wiring 32 is formed. Due to this, heat of a higher temperature can be applied than Modification 1 of Embodiment 4 in the step of forming the multilayer wiring 32.

In Modification 2 of Embodiment 4, a plurality of metal columns 14 is formed in the hole 18. Therefore, it is possible to reduce the interval of the penetration electrodes. A method of forming a plurality of metal columns 14 in the hole 18 may be applied to a via-middle method.

In Embodiment 4 and Modification 2 thereof, since the electrode 34 serves as a seed when forming the metal column 14, it is not necessary to provide the guide 12. Moreover, the hydrophilic or hydrophobic properties of the guide 12 may not correspond to that of the polymers.

Embodiment 5

Embodiment 5 is an example in which metal columns 14 are used as micro-bumps that connects substrates of stacked semiconductor chips or the like. FIGS. 9(a) to 9(c), FIGS. 10(a) and 10(b), and FIG. 11 are cross-sectional views illustrating a method for manufacturing semiconductor devices according to Embodiment 5.

Figure 9A:
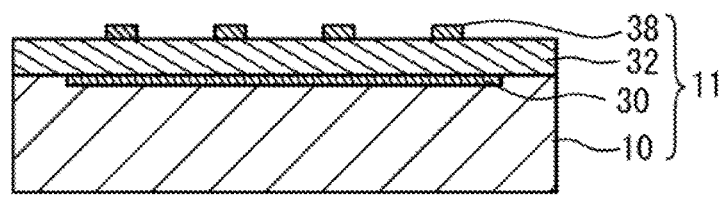
FIGS. 9(a) to 9(c) are cross-sectional views (Example 1) illustrating a method for manufacturing semiconductor devices according to Embodiment 5.

As illustrated in FIG. 9(a), a semiconductor chip 11 includes a semiconductor substrate 10, a multilayer wiring 32, and electrodes 38. A transistor region 30 is formed on an upper surface of the semiconductor substrate 10. The multilayer wiring 32 is formed on the semiconductor substrate 10. The electrodes 38 are formed on the multilayer wiring 32. A penetration electrode that passes through the semiconductor substrate 10 may be provided.

Figure 9B:
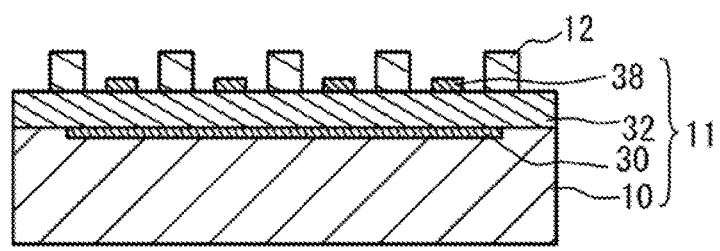

As illustrated in FIG. 9(b), guides 12 are formed on the semiconductor chip 11. The guide 12 is an insulating film, for example, and is an inorganic insulator of a silicon oxide film or the like or an organic insulator of a resin or the like. At least a side surface of the guide 12 is hydrophilic or hydrophobic. The guide 12 is formed so as to surround the electrode 38.

Figure 9C:
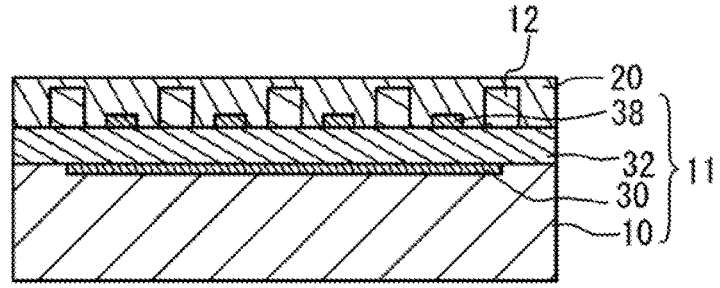

As illustrated in FIG. 9(c), a mixture 20 is formed on the semiconductor chip 11. The mixture 20 is formed so as to cover the guides 12.

Figure 10A:
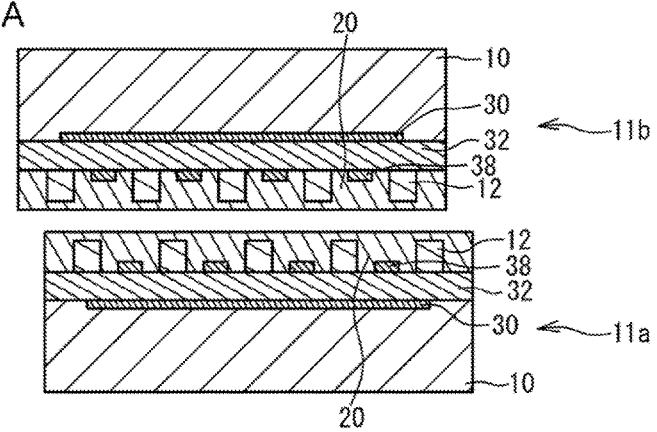
FIGS. 10(a) and 10(b) are cross-sectional views (Example 2) illustrating a method for manufacturing semiconductor devices according to Embodiment 5.
Figure 10B:
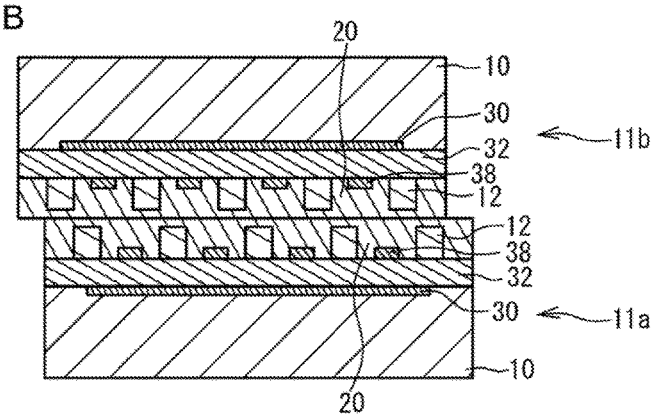

As illustrated in FIG. 10(a), semiconductor chips 11a and 11b are disposed so that the mixtures 20 face each other. The semiconductor chips 11a and 11b are the semiconductor chip 11 illustrated in FIG. 9(c), for example. In this way, a plurality of electrodes 38 are disposed on the facing surfaces of the semiconductor chips 11a and 11b. As illustrated in FIG. 10(b), the mixtures 20 of the semiconductor chips 11 and 11b are brought into contact with each other.

Figure 11:
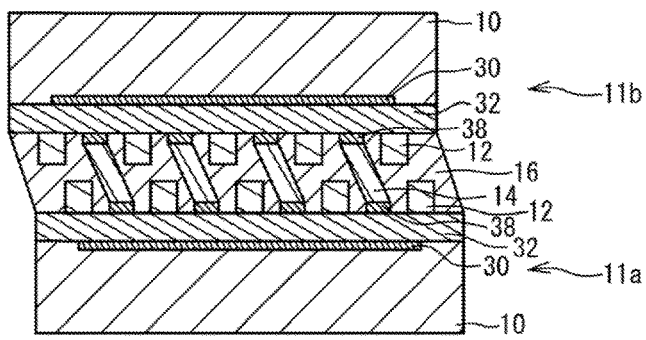
FIG. 11 is a cross-sectional view (Example 3) illustrating a method for manufacturing semiconductor devices according to Embodiment 5.

As illustrated in FIG. 11, a heat treatment is performed so that polymers agglomerate to the guide 12 to form a polymer layer 16. Metal particles agglomerate using the electrodes 38 as seeds to form metal columns 14 that connect the electrodes 38. The metal columns 14 electrically connect the semiconductor chips 11a and 11b. The diameter and the interval of the metal columns 14 are between 0.1 μm and 10 μm, for example. The height of the metal columns 14 is between 1 μm and several tens of μm, for example.

According to Embodiment 5, as illustrated in FIG. 10(a), the semiconductor chip 11b as a second substrate is disposed on the semiconductor chip 11a as a first substrate. As illustrated in FIG. 11, the metal columns 14 as bumps that electrically connect the semiconductor chips 11a and 11b are formed using Embodiments 1 and 3 and the modifications thereof. Specifically, the metal columns 14 connect the plurality of electrodes 38 of the semiconductor chip 11a and the plurality of electrodes 38 of the semiconductor chip 11b.

In the method of Non-Patent Document 1, it is difficult to decrease the electrode interval so that no bump is formed between adjacent electrodes. In Embodiment 5, since the guide 12 is provided, it is possible to form the metal columns 14 even when the interval of the electrodes 38 is small. Therefore, it is possible to realize miniaturization of bumps.

In Embodiment 5, although the guide 12 is provided in both semiconductor chips 11a and 11b, the guide 12 may be provided in at least one of the semiconductor chips 11a and 11b. Moreover, although the mixture 20 is filled in both semiconductor chips 11a and 11b, the mixture 20 may be formed in at least one surface of the semiconductor chips 11a and 11b and the mixture 20 may be filled in the guide 12 formed in at least one surface of the semiconductor chips 11a and 11b.

In Embodiment 5, although the semiconductor chips 11a and 11b are described as examples of the first and second substrates, respectively, at least one of the first and second substrates may be an interposer and may be a wiring substrate.

Embodiment 6

Figure 12:
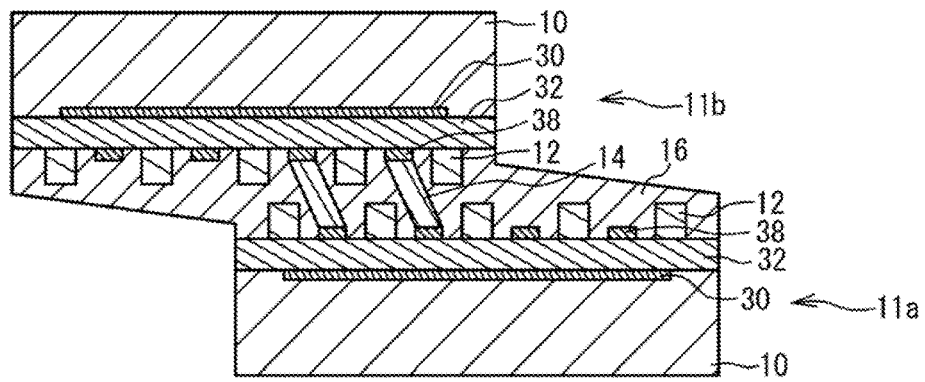
FIG. 12 illustrates an example of an alignment error occurring in Embodiment 5.

Embodiment 6 is an example in which a semiconductor chip includes a detection circuit and a switching circuit. FIG. 12 is an example of an alignment error occurring in Embodiment 5. As illustrated in FIG. 5, when the semiconductor chips 11a and 11b are disposed to face each other in Embodiment 5, alignment may deviate. In Embodiment 5, it is possible to decrease the pitch of the metal columns 14. For example, the pitch of the electrodes 38 can be set to be equal to or smaller than 1 μm. On the other hand, the alignment accuracy of the semiconductor chips 11a and 11b is several μm, for example. Therefore, when an alignment error occurs, electrodes 38 different from the electrodes 38 which are to be connected are electrically connected by the metal column 14. Embodiment 6 solves such a problem.

Figure 13:
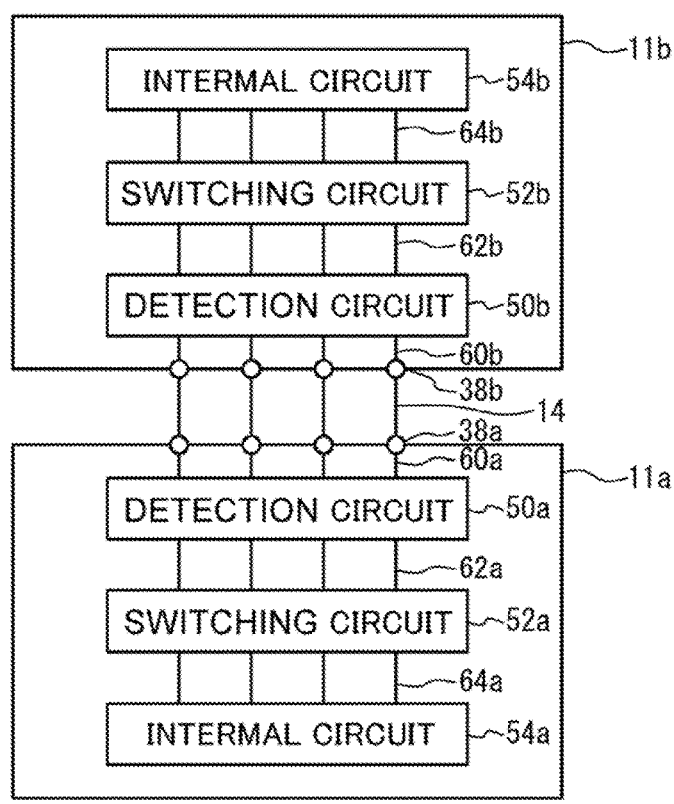
FIG. 13 is a block diagram of a semiconductor device according to Embodiment 6.

FIG. 13 is a block diagram of a semiconductor device according to Embodiment 6. Semiconductor chips 11a and 11b include detection circuits 50a and 50b, switching circuits 52a and 52b, and internal circuits 54a and 54b, respectively. The detection circuits 50a and 50b, the switching circuits 52a and 52b, and the internal circuits 54a and 54b include an electronic circuit formed by the transistors in the transistor region 30 and the multilayer wiring 32. A plurality of electrodes 38a and 38b and the detection circuits 50a and 50b are electrically connected by a plurality of wirings 60a and 60b, respectively. The detection circuits 50a and 50b and the switching circuits 52a and 52b are electrically connected by a plurality of wirings 62a and 62b, respectively. The switching circuits 52a and 52b and the internal circuits 54a and 54b are electrically connected by a plurality of wirings 64a and 64b, respectively. The plurality of electrodes 38a of the semiconductor chip 11a and the plurality of electrodes 38b of the semiconductor chip 11b are electrically connected by a plurality of metal columns 14, respectively.

The internal circuits 54a and 54b are circuits (first and second circuits) that realize the original functions of semiconductor chips and are electrically connected via the electrodes 38a and 38b and the wirings 60a and 60b to 64a and 64b, respectively. The detection circuits 50a and 50b detect an electrode 38b of the plurality of electrodes 38b to which at least one electrode 38a of the plurality of electrodes 38a is connected. The switching circuits 52a and 52b switch at least one of the connection between the internal circuit 54a and the plurality of electrodes 38a and the connection between the internal circuit 54b and the plurality of electrodes 38b on the basis of the detection results of the detection circuits 50a and 50b.

Figure 14:
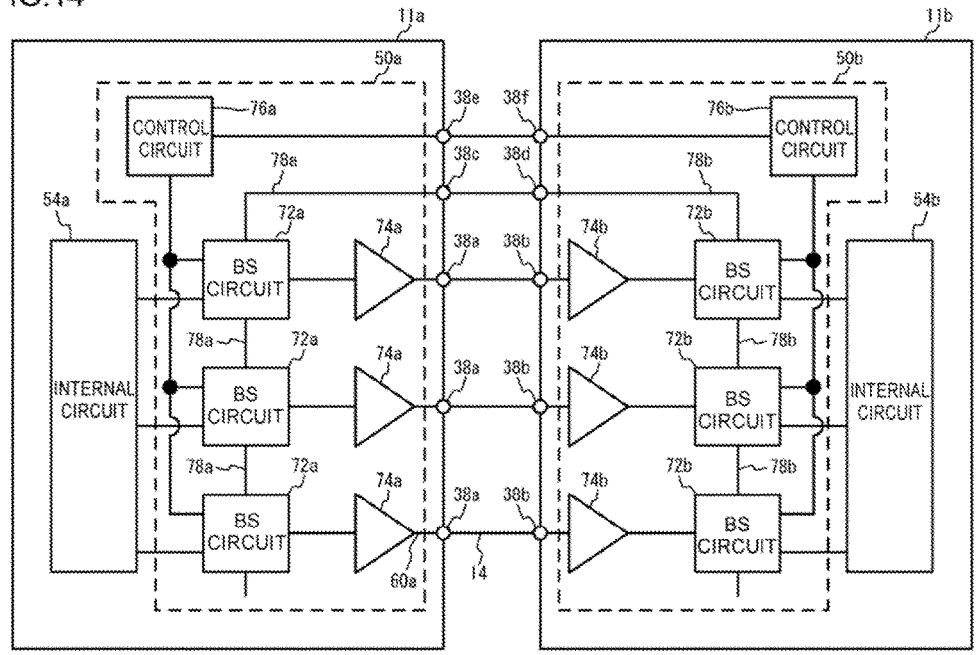
FIG. 14 is a block diagram illustrating an example of a detection circuit of Embodiment 6.

An example in which a boundary scan circuit is used as the detection circuits 50a and 50b will be described. FIG. 14 is a block diagram illustrating an example of a detection circuit according to Embodiment 6. The switching circuits 52a and 52b are not illustrated. Although a case in which signals are output from the semiconductor chip 11a to the semiconductor chip 11b is described, the same is true for a case in which signals are output from the semiconductor chip 11b to the semiconductor chip 11a.

As illustrated in FIG. 14, the semiconductor chips 11a and 11b include detection circuits 50a and 50b and internal circuits 54a and 54b, respectively. The detection circuits 50a and 50b include boundary scan (BS) circuits 72a and 72b, buffers 74a and 74b, and control circuits 76a and 76b, respectively.

The BS circuit 72a outputs signals output by the internal circuit 54a to the buffer 74a during the operation of the internal circuit 54a on the basis of an instruction from the control circuit 76a and outputs a boundary scan signal input from the adjacent BS circuit 72a to another BS circuit 72a in synchronization with clocks during boundary scan. The buffer 74a adjusts the level or the like of the signals output from the BS circuit 72a and outputs the signals to the electrodes 38a.

The BS circuit 72b outputs signals output by the internal circuit 54b to the buffer 74b during the operation of the internal circuit 54b on the basis of an instruction from the control circuit 76b and outputs a boundary scan signal input from the adjacent BS circuit 72b to another BS circuit 72b in synchronization with clocks during boundary scan. The buffer 74b adjusts the level or the like of the signals output from the BS circuit 72b and outputs the signals to the electrodes 38b.

The control circuits 76a and 76b control the BS circuits 72a and 72b and perform boundary scan. Boundary scan signals propagate through the wirings 78a and 78b. The signals propagating between the internal circuits 54a and 54b are input to or output from the electrodes 38a and 38b. The electrodes 38a and 38b are electrically connected by the metal columns 14. The boundary scan signals are input to or output from electrodes 38c and 38d which are connected by the metal columns 14. Control signals propagating between the control circuits 76a and 76b are input to or output from the electrodes 38e and 38f which are connected by the metal columns 14.

The control circuits 76a and 76b perform boundary scan whereby which electrode 38b of the plurality of electrodes 38b is connected to at least one electrode 38a of the plurality of electrodes 38a.

Due to an alignment error between the semiconductor chips 11a and 11b, when the electrodes 38c and 38d are not connected and/or the electrodes 38e and 38f are not connected, boundary scan cannot be performed. Therefore, even when the semiconductor chips 11a and 11b are misaligned, the electrodes 38c and 38d are connected and the electrodes 38e and 38f are connected. For example, a plurality of electrodes 38c to 38f is provided. Alternatively, the area of the electrodes 38c to 38f is increased. In this way, even when the semiconductor chips 11a and 11b are bonded in a misaligned state, at least one of the plurality of electrodes 38c is connected to at least one of the plurality of electrodes 38d. The same is true for the electrodes 38e and 38f.

Figure 15:
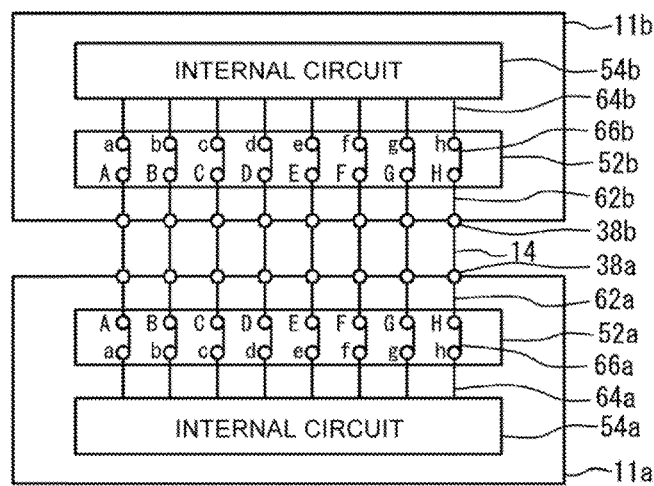
FIG. 15 is a block diagram (Example 1) for describing an example of an operation of the semiconductor device according to Embodiment 6.
Figure 16:
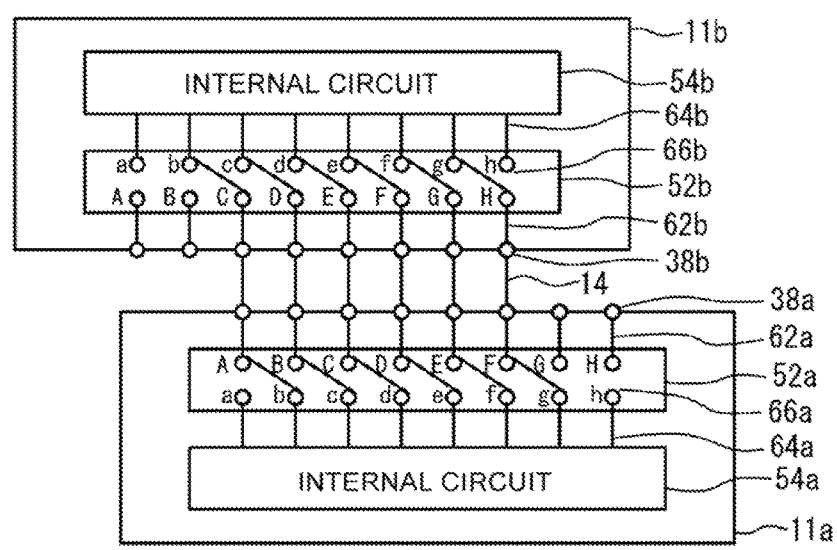
FIG. 16 is a block diagram (Example 2) for describing an example of an operation of the semiconductor device according to Embodiment 6.

FIGS. 15 and 16 are block diagrams for describing an example of an operation of a semiconductor device according to Embodiment 6. The detection circuit 50 is not illustrated. As illustrated in FIGS. 15 and 16, the switching circuits 52a and 52b include a plurality of switches 66a and 66b that switch the connection between a plurality of wirings 62a and 62b and a plurality of wirings 64a and 64b. The switches 66a and 66b can arbitrarily connect or disconnect terminals A to H connected to the plurality of wirings 62a and 62b and terminals a to h connected to the plurality of wirings 64a and 64b, respectively.

In FIG. 15, the electrodes 38a and 38b which are to be connected are connected by the metal column 14 without any shift. The switches 66a and 66b connect the terminals A to H to the terminals a to h, respectively. In this way, the internal circuits 54a and 54b are electrically connected in such a connection relation as intended.

In FIG. 16, the electrodes 38a and 38b are connected in a shifted state. In the example of FIG. 16, the electrodes 38b are connected to the electrodes 38a so as to be shifted to the left by two electrodes. The switching circuit 52a connects the terminals A to F to the terminals b to g, respectively. The switching circuit 52b connects the terminals C to H to the terminals b to g, respectively. In this way, the internal circuits 54a and 54b are electrically connected in such a connection relation as intended. The wirings 64a and 64b at both ends of the internal circuits 54a and 54b are dummy wirings.

According to Embodiment 6, the detection circuits 50a and 50b detect a connection relation between the electrodes 38a and 38b, and the switching circuits 52a and 52b switches at least one of the connection between the internal circuit 54a and the electrode 38a and the connection between the internal circuit 54b and the electrode 38b. In this way, when the alignment accuracy of the semiconductor chips 11a and 11b is larger than the pitch of the electrodes 38a and 38b, even if the connection between the electrodes 38a and 38b shifts from an intended connection relation, it is possible to connect the internal circuits 54a and 54b in an intended connection relation.

When the alignment between the semiconductor chips 11a and 11b is shifted in parallel without incurring rotation, the direction and the amount of the shift between the electrodes 38a and 38b are the same for all electrodes 38a and 38b. Due to this, for example, when the electrodes 38a and 38b are arranged at the same pitch, the switching circuits 52a and 52b may switch the connection so that the connection between the electrodes 38a and 38b is shifted in the same direction and by the same amount. Moreover, the detection circuits 50a and 50b may detect the electrode 38b to which one electrode 38a is connected. In this way, the direction and the amount of the shift between the electrodes 38a and 38b are determined.

Any one of the detection circuits 50a and 50b may not be provided. Any one of the switching circuits 52a and 52b may not be provided.

Although a case in which the semiconductor chips 11a and 11b are stacked using the method of Embodiment 5 has been described as an example in Embodiment 6, the detection circuits 50a and 50b and the switching circuits 52a and 52b may be applied when the semiconductor chips 11a and 11b are stacked by another method.

Embodiment 7

Figure 17A:
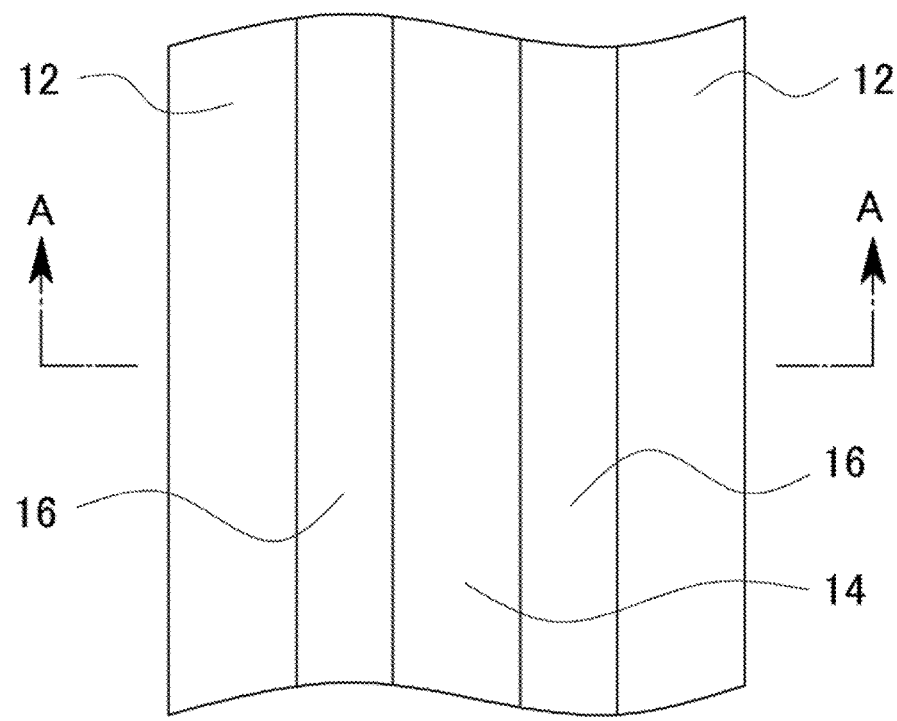
FIGS. 17(a) and 17(b) are a plan view and a cross-sectional view, respectively, illustrating a method for forming metal columns according to Embodiment 7.
Figure 17B:
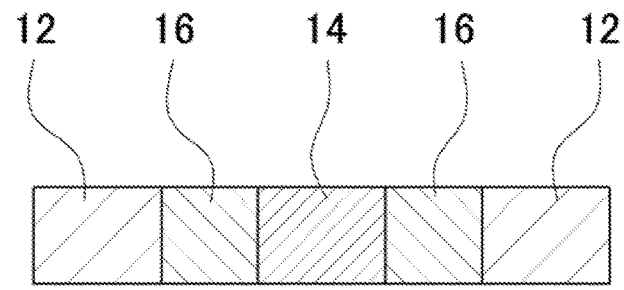

Embodiment 7 is an example for forming metal columns extending in a horizontal direction. FIGS. 17(a) and 17(b) are diagrams illustrating a method for forming metal columns 14 according to Embodiment 7. FIG. 17(a) is a plan view and FIG. 17(b) is a cross-sectional view taken along A-A in FIG. 17(a). As with Embodiment 1, a mixture containing metal particles and polymers is filled between a pair of guides 12 provided on a surface of a substrate so as to extend in a horizontal direction. After that, as illustrated in FIGS. 17(a) and 17(b), the mixture is subjected to a heat treatment so that the metal particles and the polymers are phase-separated.

In this case, the polymers agglomerate to the guides 12 to form a pair of polymer layers 16, and the metal particles agglomerate away from the guides 12 to form a metal column 14 between the polymer layers 16. The polymer layers 16 and the metal column 14 stretch in a horizontal direction along the stretching direction of the guides 12. The other configuration is the same as Embodiment 1 and the description thereof will be omitted. In this manner, according to a method for manufacturing semiconductor devices of the embodiment of the present invention, it is possible to form the metal column 14 extending in the horizontal direction as well as the metal column 14 extending in the vertical direction. Moreover, by bending the guides 12 in advance to the right or left side, it is possible to form the metal columns 14 that bend in the right or left direction as well as extending straightly.

Embodiment 8

Embodiment 8 is an example illustrating a method of narrowing the interval of metal wirings. FIGS. 18 and 19 are cross-sectional views illustrating a method for forming metal columns 14 according to Embodiment 8. As illustrated in FIG. 18(a), a pair of guides 12 formed of silicon oxides or the like is provided on a surface of a substrate 80 and a thin metal film 82 is formed so as to cover the surface of the substrate 80 and the surface of the guides 12. Furthermore, a thin guide layer 84 of the same material as the guides 12 is formed on the metal film 82 in an intermediate portion of the guides 12 at an interval from the guides 12. As with Embodiment 1, the mixture 20 containing metal particles 22 and polymers 24 is filled on the metal film 82 and the guide layer 84 on the inner side of the guides 12. In this case, the metal particles 22 and the metal film 82 are preferably formed of the same type of metal or metal having a similar contact angle.

After that, as illustrated in FIG. 18(b), the mixture 20 is subjected to a heat treatment so that the metal particles 22 and the polymers 24 are phase-separated. In this case, the metal particles 22 agglomerate to the guides 12 to which the metal film 82 is exposed to form a pair of metal columns 14, and the polymers 24 agglomerate in the range of the guide layer 84 between the metal columns 14 to form the polymer layer 16. The metal film 82 exposed to the surface of the guides 12 and the metal film 82 under the polymer layer 16 are removed, whereby the metal columns 14 separated from each other can be formed. In this way, it is possible to form the metal columns 14 at a narrower interval and to further narrow the interval between the metal wirings formed from the metal columns 14 than when the metal column 14 is formed between the polymer layers 16 as illustrated in FIG. 17 and Embodiment 7. The metal columns 14 may form wirings that extend in the vertical direction and may form wirings that extend in the horizontal direction.

As a modification of Embodiment 8, as illustrated in FIG. 19(a), a pair of metallic core portions 86 is provided on the surface of the substrate 80, and a thin film 88 formed from silicon oxides or the like is formed so as to cover the surface of the substrate 80 and the surface of the core portions 86. Here, the core portions 86 and the thin film 88 in the portions covering the core portions 86 form the guides 12. As with Embodiment 1, the mixture 20 containing the metal particles 22 and the polymers 24 is filled on the thin film 88 on the inner side of the guides 12.

After that, as illustrated in FIG. 19(b), the mixture 20 is subjected to a heat treatment so that the metal particles 22 and the polymers 24 are phase-separated. In this case, the polymers 24 agglomerate along the thin film 88 to form the polymer layer 16 between the guides 12 so as to cover the surface of the thin film 88, and the metal particles 22 agglomerate to the central portion of the surface of the polymer layer 16 to form the metal column 14. The thin film 88 on the upper portion of the core portions 86 is removed whereby the metallic core portions 86 and the metal column 14 can be formed. When the metallic core portions 86 and the metal column 14 are used as metallic wirings, it is possible to form metal wirings at a narrower interval than Embodiment 7 illustrated in FIG. 17. The metallic core portions 86 and the metal column 17 may form wirings extending in the vertical direction and may form wirings extending in the horizontal direction.

Embodiment 9

Figure 20A:
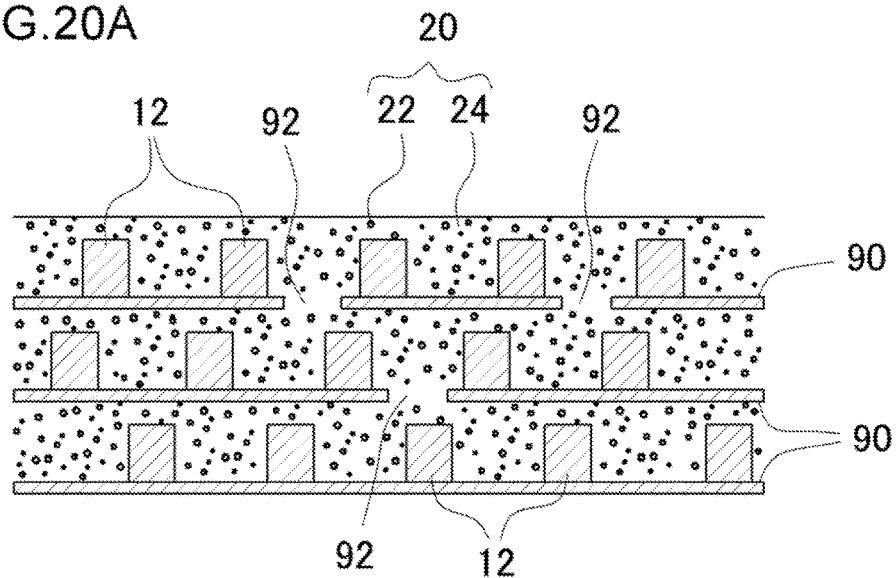
FIGS. 20(a) and 20(b) are cross-sectional views before and after a heat treatment is performed, respectively, illustrating a method for forming metal columns according to Embodiment 9.
Figure 20B:
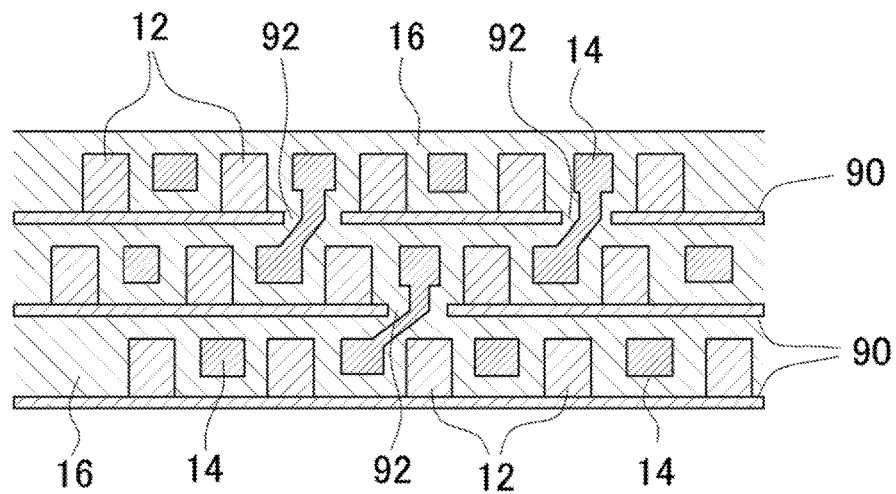

Embodiment 9 is an example illustrating a method of performing wiring in multiple layers at a time. FIGS. 20(a) and 20(b) are cross-sectional views illustrating a method for forming metal columns 14 according to Embodiment 9. As illustrated in FIG. 20(a), first, a plurality of guides 12 is provided on a surface of a thin planar support 90 as a lowermost layer so as to extend in a horizontal direction, and a mixture 20 containing metal particles 22 and polymers 24 is filled between the guides 12 as with Embodiment 1. Subsequently, another support 90 as the second layer from the bottom is stacked thereon, and similarly, a plurality of guides 12 is provided and the mixture 20 is filled. In this manner, a plurality of layers each including the support 90, the guides 12, and the mixture 20 are stacked. The support 90 is preferably formed of the same material as the guides 12.

After that, as illustrated in FIG. 20(b), the mixture 20 is subjected to a heat treatment so that the metal particles 22 and the polymers 23 are phase-separated. In this case, the polymers 24 agglomerate to the support 90 and the guides 12 to form the polymer layer 16, and the metal particles 22 agglomerate away from the support 90 and the guides 12 to form the metal column in the polymer layer 16. The other configuration is the same as Embodiment 1, and the description thereof will be omitted. In this way, it is possible to form the metal columns 14 at a time in the respective layers in which the plurality of supports 90 are stacked. Due to this, by removing the polymer layer 16, it is possible to form multilayer wirings.

As illustrated in FIGS. 20(a) and 20 (b), a hole 92 is formed between the respective guides 12 of the support 90. In this way, it is possible to connect the metal columns 14 formed on the surface of the support 90 to the metal columns 14 formed on the lower support 90 and to electrically connect the layers between the respective supports 90. The respective guides 12 are preferably provided on the surface of the support 90 so that the space between the respective guides 12 can be accessed from the lateral side of the support 90 and the formed polymer layer 16 can be removed.

While preferred embodiments of the invention have been described in detail, the present invention is not limited to the specific embodiments, and various modifications and changes can be made without departing from the scope of the present invention defined in the claims.

REFERENCE SIGNS LIST

10: Semiconductor substrate
11, 11a, 11b: Semiconductor chip
12: Guide
14: Metal column
16: Polymer layer
16a: First polymer layer
16b: Second polymer layer
18: Hole
20: Mixture
22: Metal particle
24: Polymer
26: Insulating film
28, 34, 38, 38a to 38f, 40: Electrode
30: Transistor region
32: Multilayer wiring
36: Wiring
50a, 50b: Detection circuit
52a, 52b: Switching circuit
54a, 54b: Internal circuit
60a, 60b, 62a, 62b, 64a, 64b: Wiring
66a, 66b: Switch
72a, 72b: BS circuit
74a, 74b: Buffer
76a, 76b: Control circuit
78a, 78b: Wiring
80: Substrate
82: Metal film
84: Guide layer
86: Core portion
88: Thin film
90: Support
92: Hole

The invention claimed is:
1. A semiconductor device comprising:
a metal column that extends in a stretching direction;

a polymer layer that directly contacts the metal column from a direction crossing the stretching direction;
a guide that surrounds the polymer layer in the crossing direction so as to be spaced from the metal column with the polymer layer interposed therebetween;
a first substrate and a second substrate stacked in the stretching direction,
wherein the metal column is a bump that electrically connects the first and second substrates;
a plurality of first electrodes provided on a surface of the first substrate facing the second substrate;
a plurality of second electrodes provided on a surface of the second substrate facing the first substrate,
wherein the metal column connects the plurality of first electrodes and the plurality of second electrodes;
a first circuit provided in the first substrate so as to be electrically connected to the plurality of first electrodes;
a second circuit provided in the second substrate so as to be electrically connected to the plurality of second electrodes;
a detection circuit that detects a second electrode of the plurality of second electrodes to which at least one first electrode of the plurality of first electrodes is connected; and
a switching circuit that switches at least one of connection between the first circuit and the plurality of first electrodes and connection between the second circuit and the plurality of second electrodes on the basis of a detection result of the detection circuit.

2. The semiconductor device according to claim 1, wherein the guide is provided in at least one of the first and second substrates.

3. The semiconductor device according to claim 1, wherein an inner portion of the guide is formed of metal.

4. The semiconductor device according to claim 1, wherein the metal column is a multi-particle member.

5. The semiconductor device according to claim 1, wherein a material of the metal column has a melting point equal to or higher than a melting point of a material of the polymer layer.

6. A semiconductor device comprising:
a metal column that extends in a stretching direction;
a polymer layer that directly contacts the metal column from a direction crossing the stretching direction; and
a guide that surrounds the polymer layer in the crossing direction so as to be spaced from the metal column with the polymer layer interposed therebetween,
wherein the guide is hydrophilic, and a region of the polymer layer making contact with the guide is hydrophilic.

7. The semiconductor device according to claim 6, further comprising:
a semiconductor substrate, wherein
the guide is an insulator film formed on an inner surface of a through-hole that passes through the semiconductor substrate,
the polymer layer is filled in the through-hole, and
the metal column is a penetration electrode that passes through the polymer layer.

8. The semiconductor device according to claim 6, wherein
the metal column stretches in a horizontal direction,
the polymer layer is provided so as to sandwich the metal column from a direction crossing the stretching direction, and
a pair of the guides is provided so as to sandwich the metal column and the polymer layer in the crossing direction so as to be spaced from the metal column with the polymer layer interposed therebetween.

9. The semiconductor device according to claim 8, wherein the semiconductor device is formed by stacking a plurality of planar supports in which one or a plurality of the metal columns and a plurality of the guides are provided so as to stretch along a surface in a vertical direction to the surface.

10. The semiconductor device according to claim 6, wherein
the polymer layer includes a hydrophilic polymer layer provided on an inner side of the guide and a hydrophobic polymer layer provided on an inner side of the hydrophilic polymer layer, and
the metal column is provided on an inner side of the hydrophobic polymer layer.

11. The semiconductor device according to claim 6, wherein an inner portion of the guide is formed of metal.

12. The semiconductor device according to claim 6, wherein the metal column is a multi-particle member.

13. The semiconductor device according to claim 6, wherein a material of the metal column has a melting point equal to or higher than a melting point of a material of the polymer layer.

14. A semiconductor device comprising:
a metal column that extends in a stretching direction;
a polymer layer that directly contacts the metal column from a direction crossing the stretching direction; and
a guide that surrounds the polymer layer in the crossing direction so as to be spaced from the metal column with the polymer layer interposed therebetween,
wherein the guide is hydrophobic and a region of the polymer layer making contact with the guide is hydrophobic.

15. The semiconductor device according to claim 14, wherein
the polymer layer includes a hydrophobic polymer layer provided on an inner side of the guide and
a hydrophilic polymer layer provided on an inner side of the hydrophilic polymer layer, and the metal column is provided on an inner side of the hydrophilic polymer layer.

16. The semiconductor device according to claim 14, further comprising:
a semiconductor substrate, wherein
the guide is an insulator film formed on an inner surface of a through-hole that passes through the semiconductor substrate,
the polymer layer is filled in the through-hole, and
the metal column is a penetration electrode that passes through the polymer layer.

17. The semiconductor device according to claim 14, wherein
the metal column stretches in a horizontal direction,
the polymer layer is provided so as to sandwich the metal column from a direction crossing the stretching direction, and
a pair of the guides is provided so as to sandwich the metal column and the polymer layer in the crossing direction so as to be spaced from the metal column with the polymer layer interposed therebetween.

18. The semiconductor device according to claim 17, wherein the semiconductor device is formed by stacking a plurality of planar supports in which one or a plurality of the metal columns and a plurality of the guides are provided so as to stretch along a surface in a vertical direction to the surface.

19. The semiconductor device according to claim 14, wherein an inner portion of the guide is formed of metal.

20. The semiconductor device according to claim 14, wherein the metal column is a multi-particle member.

21. The semiconductor device according to claim 14, wherein a material of the metal column has a melting point equal to or higher than a melting point of a material of the polymer layer.

* * * * *